United States Patent [19]

Saeki et al.

[11] Patent Number: 5,373,471
[45] Date of Patent: Dec. 13, 1994

[54] SEMICONDUCTOR MEMORY DEVICE HAVING REDUNDANCY MEMORY CELLS FOR REPLACING DEFECTIVE

[75] Inventors: Makoto Saeki, Koganei; Kiyoshi Nagai, Kodaira; Hisae Yamamura, Yokohama; Tadashi Abe, Yamanashi; Takeshi Fukazawa, Kodaira, all of Japan

[73] Assignee: Hitachi, Ltd., Tokyo, Japan

[21] Appl. No.: 934,332

[22] Filed: Aug. 25, 1992

[30] Foreign Application Priority Data

Sep. 5, 1991 [JP] Japan .................................. 3-254612
Jun. 15, 1992 [JP] Japan .................................. 4-180389

[51] Int. Cl.$^5$ ................................................ G11C 7/00
[52] U.S. Cl. .................................. 365/200; 365/225.7;
365/230.09; 365/189.04; 365/201
[58] Field of Search ............... 365/200, 230.09, 189.04,
365/230.05, 201, 225.7; 371/10.2, 10.3

[56] References Cited

U.S. PATENT DOCUMENTS 5,021,944  6/1991  Sasaki et al. ..................... 365/200
5,251,168 10/1993  Chung et al. ................... 365/230.03

FOREIGN PATENT DOCUMENTS 2-21500  1/1990  Japan .

Primary Examiner—Eugene R. LaRoche
Assistant Examiner—Huan Hoang
Attorney, Agent, or Firm—Fay, Sharpe, Beall, Fagan, Minnich & McKee

[57] ABSTRACT

In case an address is to access a defective memory cell, a defective memory cell in a memory cell area contained in one of paired memory mats is selected in parallel with a redundant memory cell in a redundant memory cell area contained in the other memory mat. At this time of selecting the redundant main word line for selecting the redundant memory cell, there is not required the logical operation for deciding whether or not the redundant use of the access address fed from the outside is proper. For example, the redundant main word line is set to the select level on the basis of a chip select signal. As a result, the drive start timing of the redundant main word line is not delayed in the least from the drive start timing of the main word line. Thus, it is possible to prevent the event that the select drive timing of the redundant sub word line is delayed on account of the delay in the drive timing of the redundant main word line.

20 Claims, 19 Drawing Sheets

|         | INH*        | XS    | XS*   |
|---------|-------------|-------|-------|
| UNSAVED | HIGH LEVEL  | $X_9$ | $X_9*$ |
| SAVED   | LOW LEVEL   | $X_9*$ | $X_9$ |

FIG. 12(a)
ADDRESS BUFFER (ABUFF)
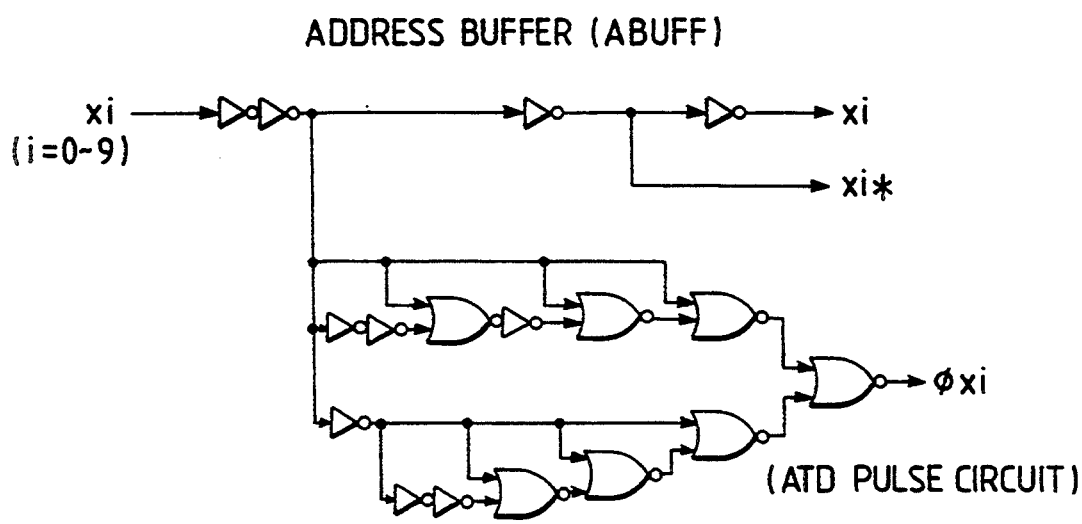
(ATD PULSE CIRCUIT)
FIG. 12(b)
PREDECODER (PRDEC)
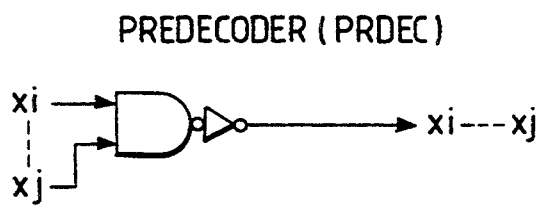
WORD PREDECODER (WPRDEC)
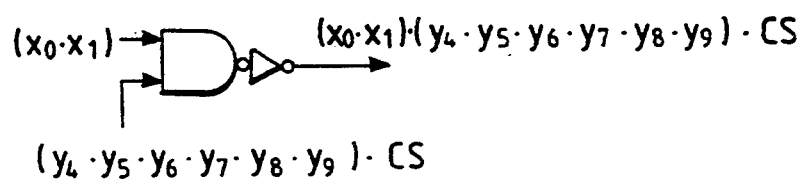
FIG. 12(c)

FIG. 16
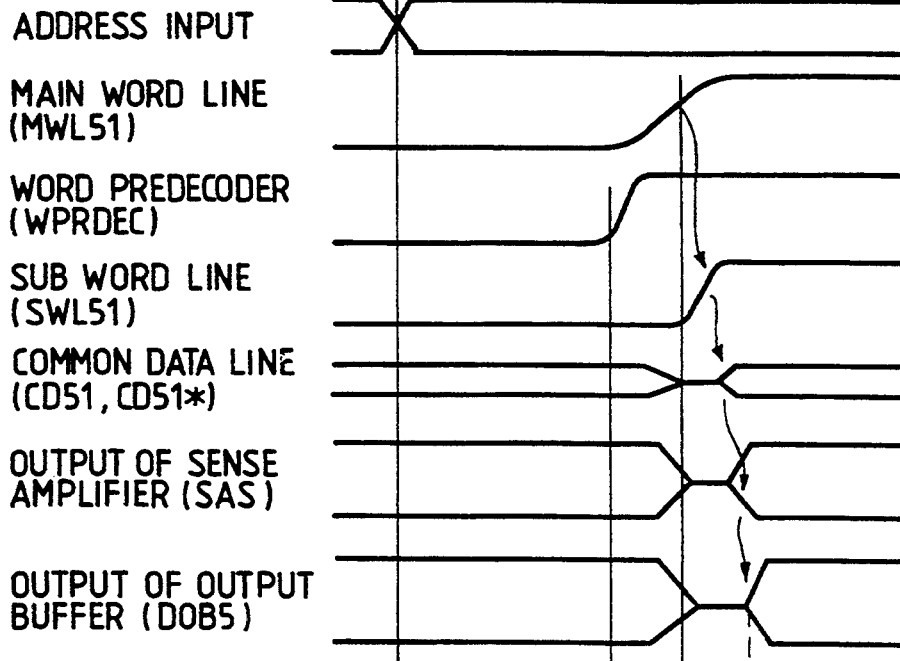
(A) SELECT OF MEMORY CELL
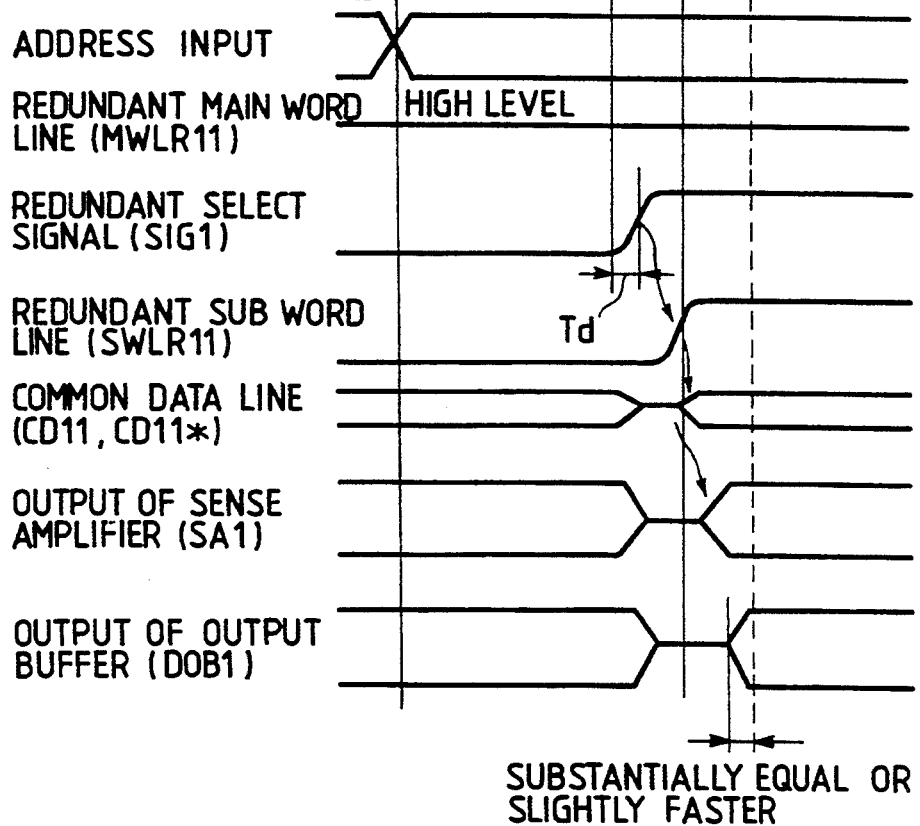
(B) SELECT OF REDUNDANT MEMORY CELL
SUBSTANTIALLY EQUAL OR SLIGHTLY FASTER (A) SELECT OF MEMORY CELL

ADDRESS INPUT

MAIN WORD LINE

OUTPUT OF WORD PREDECODER

SUB WORD LINE

COMMON DATA LINE

OUTPUT OF SENSE AMPLIFIER

OUTPUT OF OUTPUT BUFFER (B) SELECT OF REDUNDANT MEMORY CELL

ADDRESS INPUT

REDUNDANT MAIN WORD LINE

OUTPUT OF WORD PREDECODER

SUB WORD LINE

COMMON DATA LINE

OUTPUT OF SENSE AMPLIFIER

OUTPUT OF OUTPUT BUFFER

SEMICONDUCTOR MEMORY DEVICE HAVING REDUNDANCY MEMORY CELLS FOR REPLACING DEFECTIVE

BACKGROUND OF THE INVENTION

The present invention relates to a semiconductor memory device having redundant memory cells and, more particularly, to a technology for reading out data at a high speed from the redundant memory cells, namely, a technology which is effective if applied to a static or dynamic RAM (i.e., Random Access Memory) or a single chip microcomputer including such RAM.

The technology of the prior art for reading out data at a high speed from the redundant memory cells is disclosed in Japanese Patent Laid-Open No. 21500/1990. According to this prior art, a word line included in one memory mat is selected together with a redundant memory cell of another memory mat adjoining the former, and a sense amplifier at said another memory mat including the redundant memory cell is activated, if the access address at this time is to a defective cell, whereas the sense amplifier at said one memory mat is activated if the access address is not to a defective cell. Thus, the data read from the redundant memory cell is speeded up by selecting the redundant memory cell without awaiting the result of decision of necessity for the redundant saving of the access address and by handling the conflict between the necessary and unnecessary read data with a selective activation of the sense amplifier.

Here, the prior art has a word line structure called the "divided word line structure". This structure has a common main word line shared among a plurality of memory mats and a plurality of sub word lines intrinsic to the individual memory mats. The main word line transmits a word line select signal commonly to the plurality of memory mats. The sub word lines are drive by a sub word driver which is made receptive of a transmission signal of the main word line and a control signal for outputting a drive signal. According to the prior art, therefore, the word lines to be selected simultaneously by the individual adjoining memory mats are the sub word lines and the corresponding main word line.

In the prior art, however, our investigations have found out that there is a large delay in the timing for selecting the main word line at the redundant memory cell, as will be described in the following. The sub word lines arranged at each memory mat are not driven to their select level till the select signal from the main word line is transmitted to the sub word driver. At this time, the main word line for feeding the select signal commonly to the individual memory mats has a larger wiring length than that of the sub word lines so that it forms a relatively high undesired delay component with the capacity and/or resistance components parasitic thereto. In order to drive the redundant main word line and the sub word lines for the redundant memory cells to the select level, moreover, whether or not the access address is to a defective cell to be redundantly replaced has to be decided through a logic of a redundant program circuit or the like. As compared with the case of selecting memory cells included in one memory mat, the timing for selecting the redundant memory cells in the adjoining memory mat is delayed by the rise of the main word line for the redundant selection so that an identically fast access cannot be warranted for the products with and without redundant memory cells.

SUMMARY OF THE INVENTION

An object of the present invention is to provide a semiconductor memory device capable of suppressing an elongation of an access time for redundant memory cells.

Another object of the present invention is to provide a semiconductor memory device capable of warranting an equal accessing speed no matter whether a redundantly saved memory cell might exist or not.

The foregoing and other objects and novel features of the present invention will become apparent from the following description to be made with reference to the accompanying drawings.

Representatives of the invention to be disclosed herein will be briefly summarized in the following.

Specifically, a semiconductor memory device according to the present invention comprises: redundant program means for causing the address of a defective one of memory cells of one of a plurality of memory mats of the divided word line structure, which has a main word line and sub word lines, to correspond electrically to the address of a redundant memory cell included in an other memory mat; and redundant main word line drive means for driving the redundant main word line for the redundant memory cell to be caused to correspond by said redundant program means, to a select level independently of the output of said redundant program means, so that either the read signal from said one memory mat or the signal read out from said other memory mat through said redundant program means and said redundant main word line drive means may be selected. At this time, which of the memory mats has its read signal selected is determined depending upon whether or not the access address is one programmed by the redundant program means.

Even if the selection timing of the redundant memory cell should be delayed with respect to that of the memory cells, this delay could be offset by the operational spare time. For this offset, the data output buffers, which are individually assigned to the aforementioned one and other memory mats, are selectively activated to select any of the read signals from the two memory mats. Alternatively, a single data output buffer may be shared between the two memory mats, and sense amplifiers arranged upstream of the former to correspond to the individual memory mats may be selectively activated and controlled to select the read data from one of the memory mats.

In order to realize relatively easily the structure, in which memory cells are selected in parallel individually in one memory mat having the defective memory cell and the other memory mat including redundant memory cells to be used for replacing the defective memory cell so that one of the data selected at both sides may be adopted as the normal read data, it is advisable to adopt the LOC structure which has the memory mats arranged in a vertically divided manner across a bonding pad.

In order to further shorten the access time for the redundant memory cells, a redundant memory cell area may be arranged close to the central portion near the bonding pad so that the transmission passage of the data from the redundant memory cells may be shorter than the longest transmission passage from the memory cell area.

According to the means thus far described, the forced drive of the redundant main word lines for the redundant memory cells to be caused to correspond by the aforementioned redundant program means to the select level independently of the output of the redundant program means makes it possible to drive the redundant main word line to the select level without awaiting the decision of the logical operation on whether or not the access address is to a defective cell. The redundant main word line thus forcibly driven to the select level is caused to belong to a memory mat other than that of the main word line of the defective memory cell corresponding directly to the access address. This warrants it that the redundant main word line to be driven to the select level and the main word line of the defective memory cell are set in parallel to the select level. After the memory cells have thus been selected in parallel in the one memory mat including the defective memory cell and in the other memory mat including the redundant memory cells to be used for the replacing, any of the data selected at both sides is adopted as the normal read data. Here, the normal data are those to be read out from the memory cells in case no replacing is necessary and are those to be read out from the redundant memory cells in case the replacing is necessary.

BRIEF DESCRIPTION OF THE DRAWINGS

FIGS. 12(a), 12(b) and (c) are logical circuit diagrams showing examples of an address buffer, a predecoder and a word predecoder, respectively;

FIG. 16 shows the operation timing of one example of the static RAM according to the present embodiment and presents a timing chart at (A) when a memory cell MC is selected and a timing chart at (B) when a redundant memory cell RMC is selected;

DESCRIPTION OF THE PREFERRED EMBODIMENTS

Figure 2:
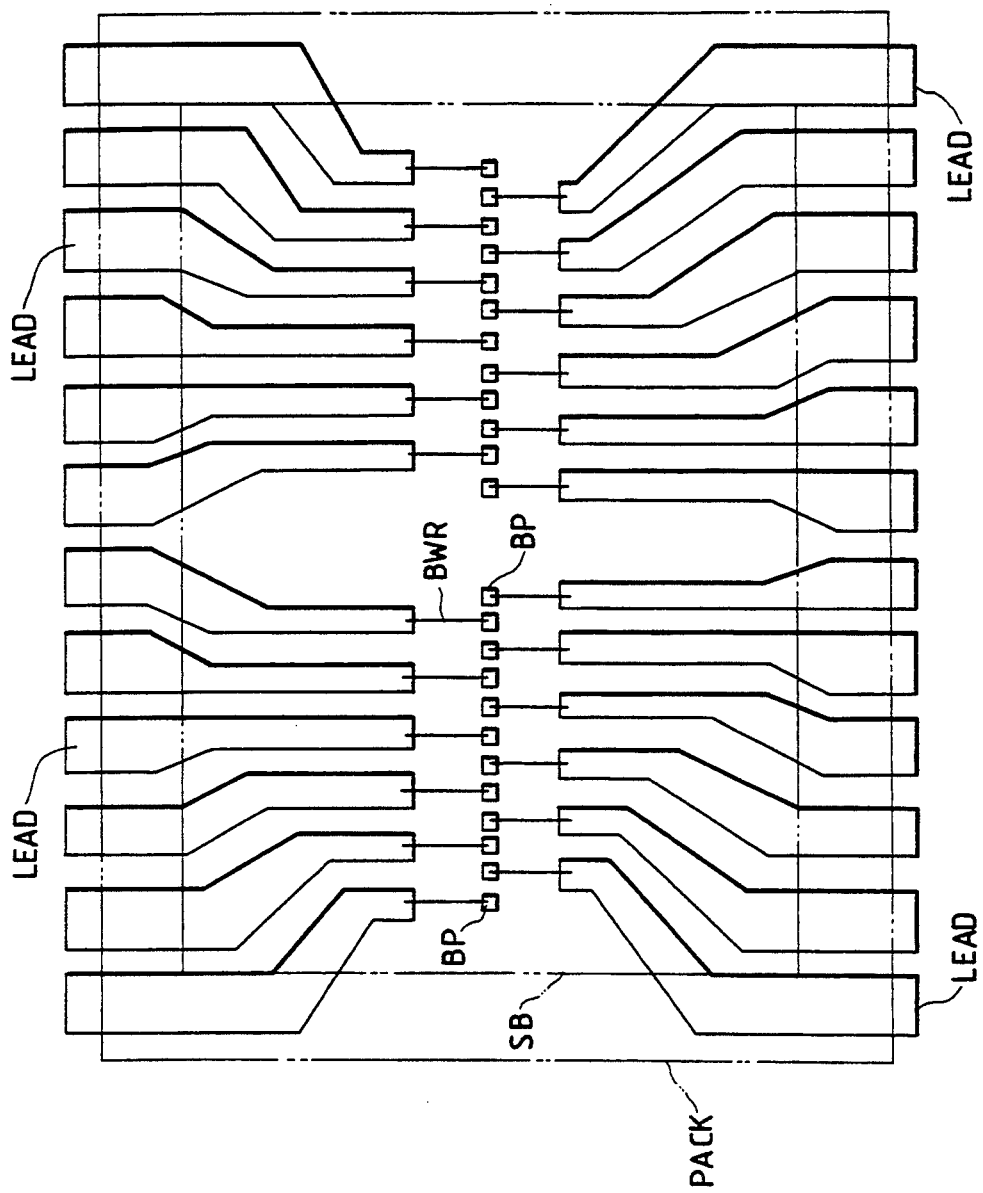
FIG. 2 is an explanatory diagram showing the static RAM in a packaged state according to one embodiment of the present invention.

FIG. 2 shows the state, in which a static RAM according to one embodiment of the present invention is packaged.

The static RAM of the present embodiment is formed in a single semiconductor substrate SB of silicon or the like by the well-known CMOS semiconductor integrated circuit manufacture technology, although not especially limitative thereto. This static RAM is packaged in a LOC (i.e., Lead On Chip) package PACK, and a number of bonding pads BP are juxtaposed at the central portion of the semiconductor substrate SB, although not especially limitative thereto. The semiconductor substrate SB in the chip state is fixed on lead terminals LEAD which extend from the peripheral edges to the inside of the package PACK. The lead terminals LEAD have their leading ends coupled to the predetermined ones of the bonding pads BP through bonding wires BWR. In this LOC type, the bonding pads BP for transferring signals with the outside are arranged at the central portion of the chip so that the wiring length to a desired internal circuit can be relatively shortened to minimize the delay in the signal propagations due to the undesired resistance and/or capacity components of the wiring. Moreover, a smaller package can be adopted than that of the type, in which the bonding pads are arranged in the peripheral edges of the chip.

Figure 3:
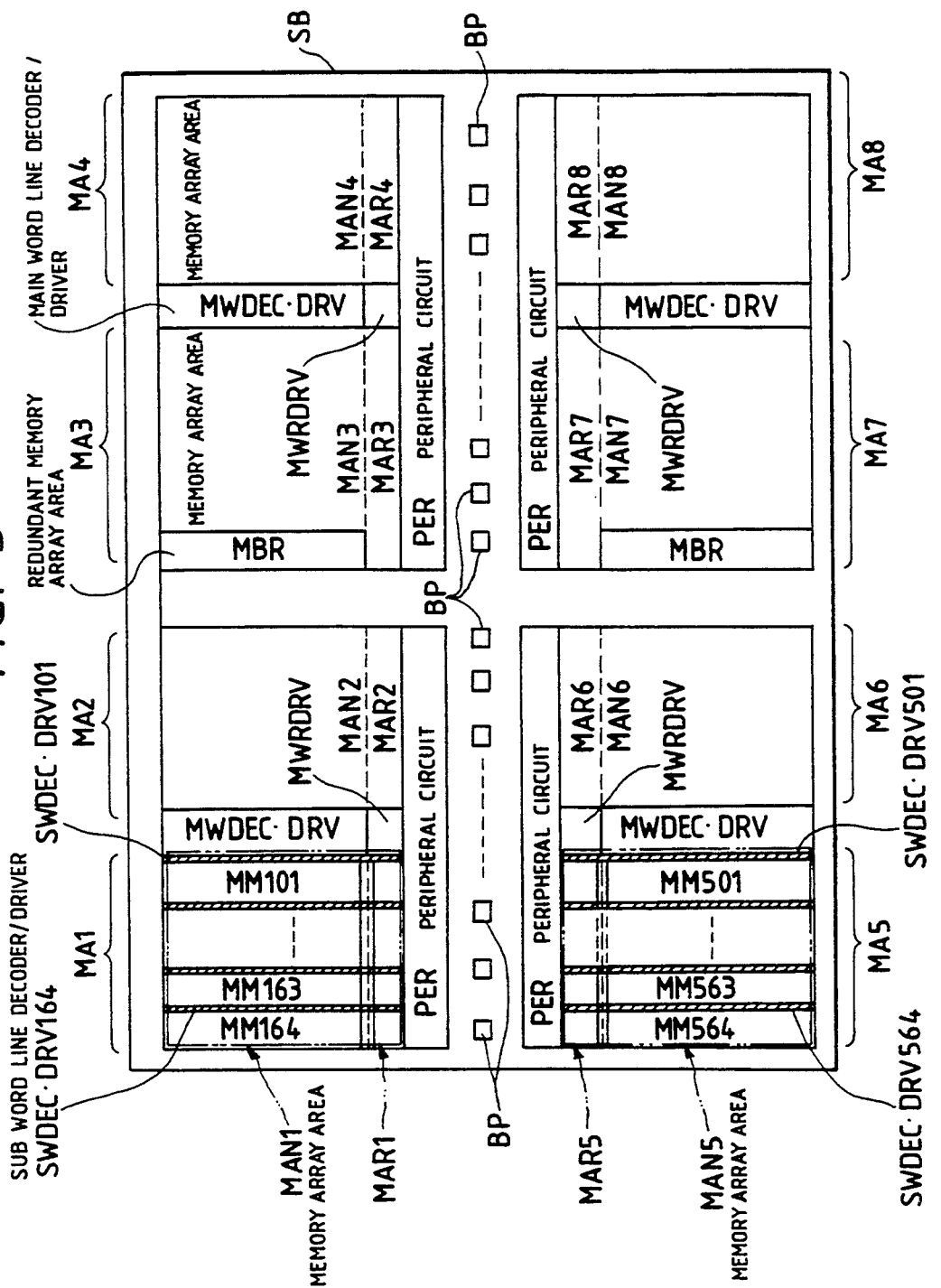
FIG. 3 is a top plan view showing a chip of the static RAM according to one embodiment of the present invention.

FIG. 3 is a top plan view showing one example of the static RAM according to one embodiment of the present invention.

The numerous bonding pads BP arrayed at the central portion of the semiconductor substrate SB are arranged thereabove with four memory arrays MA1 to MA4 and therebelow with four memory arrays MA5 to MA8. In the individual memory arrays MA1 to MA8, the areas close to the bonding pads BP are provided for redundant memory array areas MAR1 to MAR8, and the outer areas are provided for memory array areas MAN1 to MAN8. Moreover, each of the memory arrays MA1 to MA8 is divided into sixteen memory mats, although not especially limitative thereto. For example, the memory array MA1 is divided into memory mats MM101 to MM164, and the memory array MA5 is divided into memory mats MM501 to MM564. Here, the redundant memory array areas MAR1 to MAR8 are provided for redundant memory cells which will replace defective memory cells, if any, as contained in the memory array areas MAN1 to MAN8.

The static RAM of the present embodiment adopts the divided word line structure which has a main word line shared among all the memory mats of the individual memory arrays MA1 to MA8 and sub word lines wired in the individual memory mats, as will be detailed hereinafter. In FIG. 3 reference letters MWDEC-DRV designate a driver and an address decoder of the main word line corresponding to each of the memory array areas MAN 1 to MAN8, and letters MWRDRV designate a select drive circuit of the main word line corresponding to each of the redundant memory array areas MAR1 to MAR8. Letters SWDEC-DRV101 to SWDEC-DRV164 in the memory array MA1 designate drivers and decoders for the sub word lines, and letters SWDEC-DRV501 to SWDEC-DRV564 in the memory array MA5 designate drivers and decoders of the sub word lines. Likewise, the remaining memory arrays have drivers and decoders of the sub word lines. Letters PER designate a variety of peripheral circuits at the memory array unit, including an address input buffer, an address change detect circuit, a column address decoder, a column select circuit, a data input/output buffer and a redundant program circuit. Incidentally, letters MBR appearing in the same Figure designate a redundant memory cell area equipped with a redundant bit line.

If, in the structure of the memory arrays arranged above and below the bonding pad BP, a defective memory cell is present in the memory array areas MAN1 to MAN4 of the memory arrays MA1 to MA4 arranged at the upper side of the Figure, the redundant memory array areas MAR5 to MAR8 at the lower side across the bonding pad are assigned to the redundant memory cells for replacing and thereby saving data that otherwise would have been saved in the defective memory cell. Likewise, the redundant memory array areas MAR1 to MAR4 at the upper side across the bonding pad are assigned to the redundant memory cells for replacing and thereby saving data that otherwise would have been saved in the defective memory cell, if any, in the memory array areas MAN5 to MAN8 of the memory arrays MA5 to MA8 arranged at the lower side of the Figure. In other words, the memory cells and the redundant memory cells for replacing the former memory cells exist in different memory arrays or memory mats across the bonding pad. Their control will be described in detail in the following.

Figure 4:
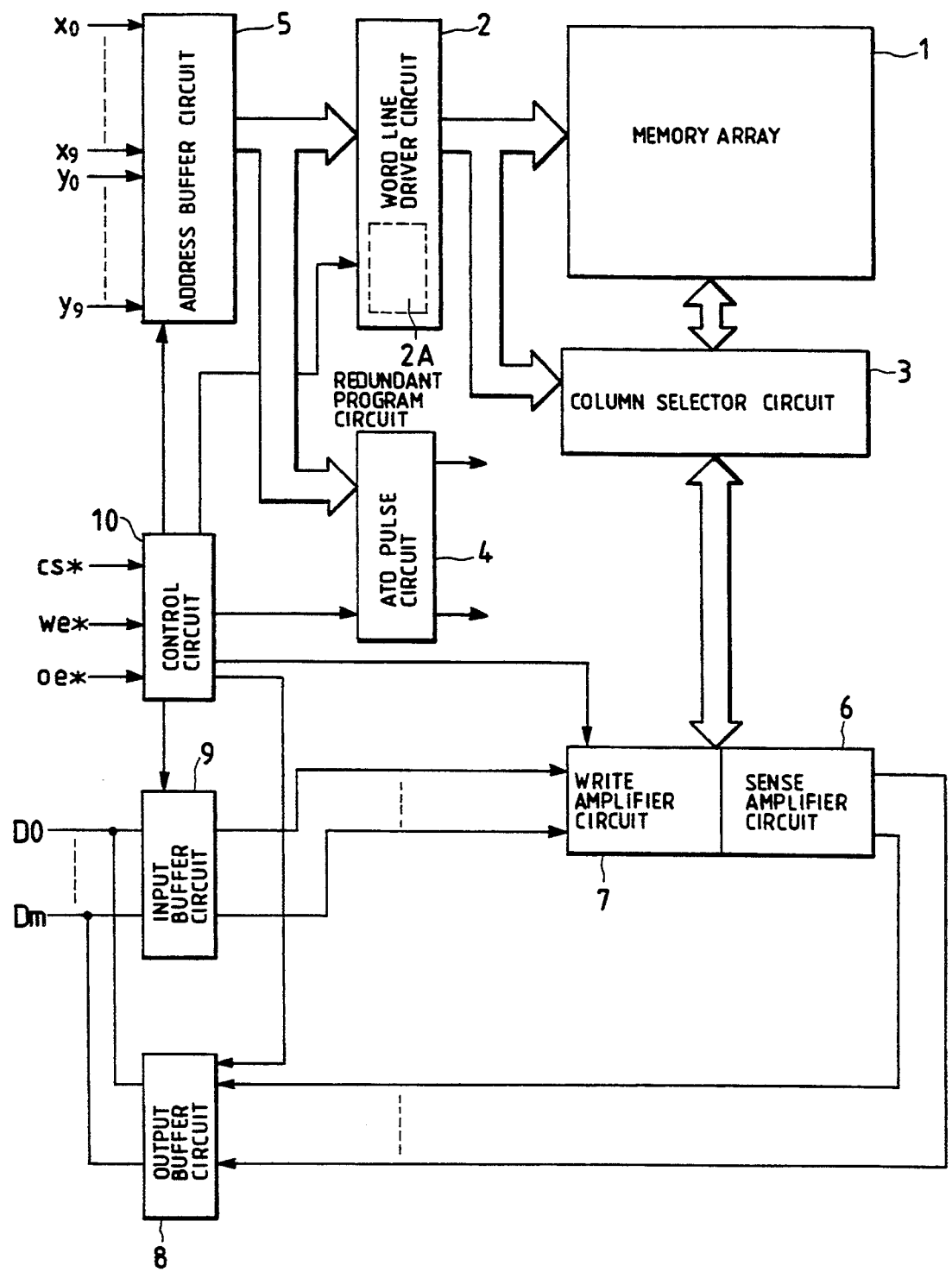
FIG. 4 is a schematic block diagram of the static RAM while noting the connection relations of the circuit blocks shown in the chip top plan view of FIG. 3.

FIG. 4 is a schematic block diagram of the static RAM while noting the connection relations of the circuit blocks shown in the chip top plan view of FIG. 3. A block, as designated at numeral 1 in the same Figure, is arranged in matrix with the memory cells and redundant memory cells which are contained in the aforementioned memory arrays MA1 to MA8. A block, as designated at numeral 2, is a word line drive circuit for generating signals to select the memory cells and the redundant memory cells in accordance with address signals x0 to x9 and y0 to y9 and for driving the main word line and the sub word lines. A block 2A contained in the circuit block 2 is a redundant program circuit for programming the address of a defective memory cell to be replaced by a redundant memory cell. Numeral 3 designates a column select circuit for selecting data lines in accordance with the column select signals generated by the block 2. Numeral 4 designates an ATD pulse circuit or a circuit block for generating a timing signal for controlling a switch circuit, which equalizes the data lines or common data lines contained in the circuit block 1 in advance to their operationally desirable levels, in synchronism with the changes in the address signals. These address signals x0 to x9 and y0 to y9 are fed through an address buffer 5 to the circuit blocks 2, 4 and so on. The aforementioned column select circuit 3 is connected with a sense amplifier 6 and a write amplifier 7. The read data having been amplified by the sense amplifier 6 are outputted through an output buffer 8 to the outside, and the data having been fed from the outside to an input buffer 9 are written in a predetermined memory through the write amplifier 7. Numeral 10 appearing in the same Figure designates a control circuit which is fed with access control signals from the outside, such as a chip select signal cs* (the symbol "*" of which indicates the inverted signal line or the inverted signal itself of a signal line or a signal having no symbol, or a row enable signals, a write enable signal we* and an output enable signal oe*, although not especially limitative thereto, to determine the internal operation mode. The chip select signal cs* instructs a chip selection if it takes a high level. The write enable signal we* instructs the write operation if it takes a high level. The output enable signal oe* instructs the read operation if it takes a high level.

Figure 1:
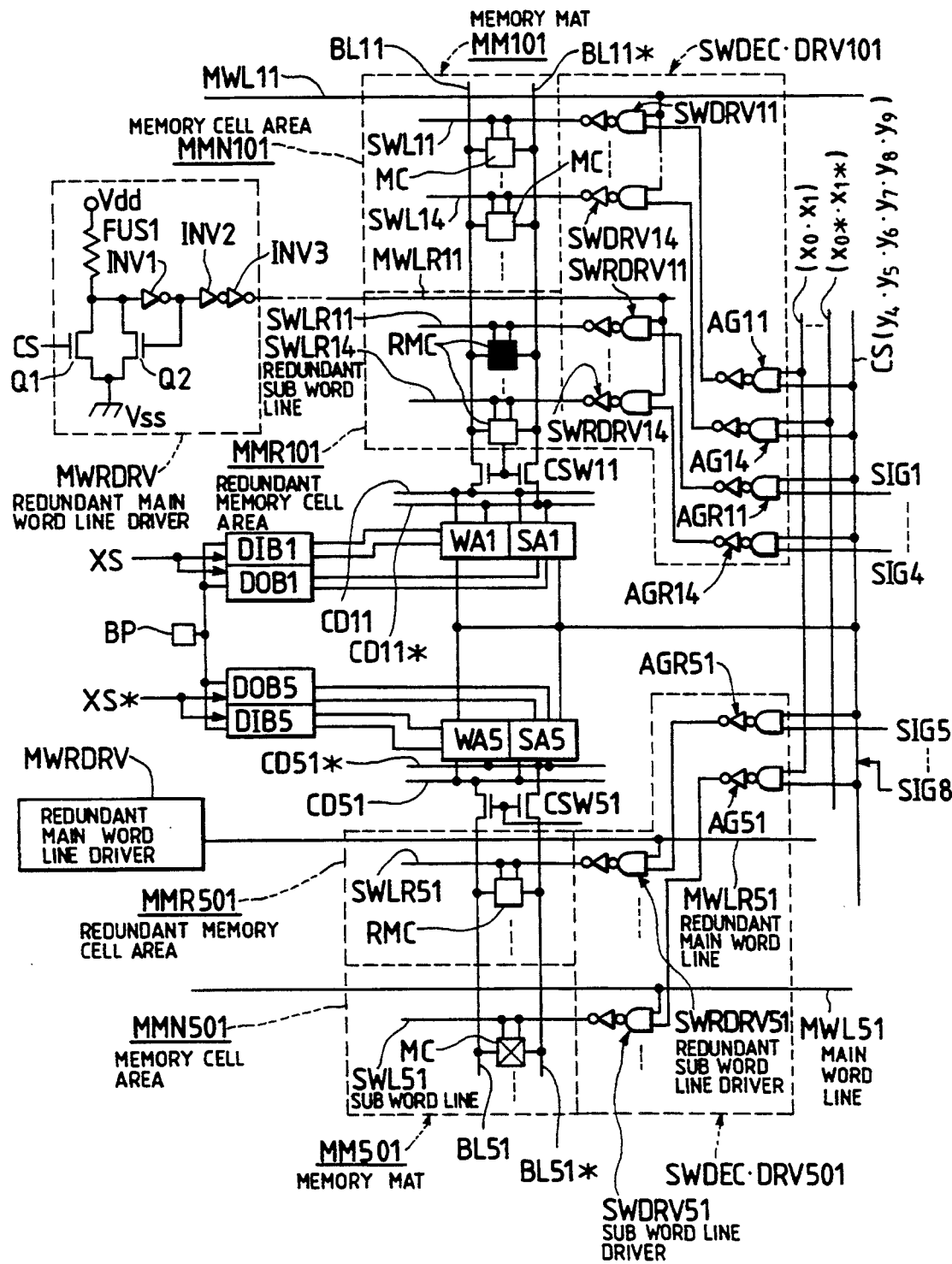
FIG. 1 is a detailed circuit diagram showing an essential portion of a static RAM according to one embodiment of the present invention.

FIG. 1 shows a detailed circuit of one embodiment close to the memory mats MM101 and MM501.

The memory mat 101, as representatively shown in the same Figure, is composed of the memory cell area MMN101 (which is contained in the memory array area MAN1) and the redundant memory cell area MMR101 (which is contained in the redundant memory array area MAR1). The memory mat 501, as representatively shown, is composed of the memory cell area MMN501 (which is contained in the memory array area MAN5) and the redundant memory cell area MMR501 (which is contained in the redundant memory array area MAR5). The aforementioned redundant memory cell area MMR101 provides an area for forming the redundant memory cell RMC for replacing the defective memory cell which undesirably exists in the memory cell area MMN501. Likewise, the redundant memory cell area MMR501 provides an area for forming the redundant memory cell RMC for replacing the defective memory cell which undesirably exists in the memory cell area MMN501.

The memory cell area MMN101 of the memory mat MM101 is representatively shown with one main word line MWL11. In the memory cell area MMN101 under consideration, two sub word lines SWL11 and SWL14 are representatively shown in the Figure although there are actually four sub word lines corresponding to one main word line. The redundant memory cell area MMR101 is representatively shown with one redundant main word line MWLR11. In the redundant memory cell area MMR101 under consideration, two redundant sub word lines SWLR11 and SWLR14 are representatively shown in the Figure although there are actually four sub word lines corresponding to one main word line. The aforementioned main word line is made of a metal wiring line of tungsten, for example, and the sub word lines are made of poly-silicon wiring lines forming the gates of the select MOSFET constituting the memory cell, for example. The memory cell MC has its select terminal coupled to each sub word line whereas the redundant memory cell RMC is coupled to each redundant sub word line, and the data input/output terminals of the memory cell MC and the redundant memory cell RMC arranged in a common column are commonly connected with complementary bit lines BL11 and BL11*. These complementary bit lines BL11 and BL11* are connected with common data lines CD11 and CD11* through the column select switch circuit CSW11, as representatively shown. Not only the input terminals of the sense amplifier SA1 but also the output terminals of the write amplifier WA1 are coupled to the common data lines CD11 and CD11*. The write amplifier WA1 is fed with the write data from the input buffer DIB1. The output of the sense amplifier SA1 is fed to the output buffer DOB1. The aforementioned input buffer DIB1 and output buffer DOB1 are controlled to an operative state to output when the select signal XS takes a high level.

In the same Figure, the memory mat MM51 has its memory cell area MMN501 shown representatively with one main word line MWL51 and one sub word line SWL51. The redundant memory cell area MMR501 is representatively shown with one redundant main word line MWLR51 and one redundant sub word line SWLR5. The aforementioned main word line is made of a metal wiring line of tungsten, for example, and the sub word line is made of a poly-silicon wiring line forming the gates of the select MOSFET constituting the memory cell, for example. The memory cell MC has its select terminal coupled to each sub word line whereas the redundant memory cell RMC is coupled to each redundant sub word line, and the data input/output terminals of the memory cell MC and the redundant memory cell RMC arranged in a common column are commonly connected with complementary bit lines BL51 and BL51*. These complementary bit lines BL51 and BL51* are connected with common data lines CD51 and CD51* through the column select switch circuit CSW51, as representatively shown. Not only the input terminals of the sense amplifier SA5 but also the output terminals of the write amplifier WA5 are coupled to the common data lines CD51 and CD51*. The write amplifier WA5 is fed with the write data from the input buffer DIB5. The output of the sense amplifier SA5 is fed to the output buffer DOB5. The input buffer DIB5 and output buffer DOB5 are controlled to an operative state to output when the select signal XS takes a high level. The output terminals of the aforementioned output buffers DOB1 and DOB5 and input buffers DIB1 and DIB5 are commonly connected with a predetermined single bonding pad BP.

Incidentally, the aforementioned memory cell MC and redundant memory cell RMC are made of a six-transistor static memory element of the complementary MOS (as will also be abbreviated as "CMOS") circuit type and are composed mainly of the static latch, in which one of a pair of CMOS inverters has its input coupled crossly to the output of the other, and an N-channel select MOSFET is coupled to the input/output terminals of the two inverters. The memory cell MC has its data input/output terminals used as the drain electrodes of the two select MOSFETs, for example, and its select terminals used as the gate electrodes as the select MOSFETs.

Here, the relations between the main word line and the sub word lines are representatively shown in FIG. 5, as will be described in connection with the main word line MWL11 by way of example. In one memory mat MM101, the single main word line MWL11 under consideration is connected with the four sub word lines SWL11, SWL12, SWL13 and SWL14. The driver for driving the sub word lines is exemplified by NAND inverter gates SWDRV11, SWDRV12, SWDRV13 and SWDRV14, each of which has its one input terminal coupled to the main word line MWL11 and its other input terminal fed with a select control signal. The select control signal to be fed to the NAND inverter gate SWDRV11 is exemplified by $x0 \cdot x1 \cdot (y4 \cdot y5 \cdot y6 \cdot y7 \cdot y8 \cdot y9) \cdot CS$; the select control signal to be fed to the NAND inverter gate SWDRV12 is exemplified by $x0^* \cdot x1 \cdot (y4 \cdot y5 \cdot y6 \cdot y7 \cdot y8 \cdot y9) \cdot CS$; the select control signal to be fed to the NAND inverter gate SWDRV13 is exemplified by $x0 \cdot x1^* \cdot (y4 \cdot y5 \cdot y6 \cdot y7 \cdot y8 \cdot y9) \cdot CS$; and the select control signal to be fed to the NAND inverter gate SWDRV14 is exemplified by $x0^* \cdot x1^* \cdot (y4 \cdot y5 \cdot y6 \cdot y7 \cdot y8 \cdot y9) \cdot CS$. In these select control signals, the two bits of x0 and x1 are deemed as those for instructing what of the four sub word lines is to be selected. The six bits of $y4 \cdot y5 \cdot y6 \cdot y7 \cdot y8 \cdot y9$ are deemed as the select signals of the memory mats, and the bits of $(y4 \cdot y5 \cdot y6 \cdot y7 \cdot y8 \cdot y9)$ are deemed as memory mat selecting y-address predecode signals. The letters CS designate an internal control signal implying a chip selection.

Figure 5:
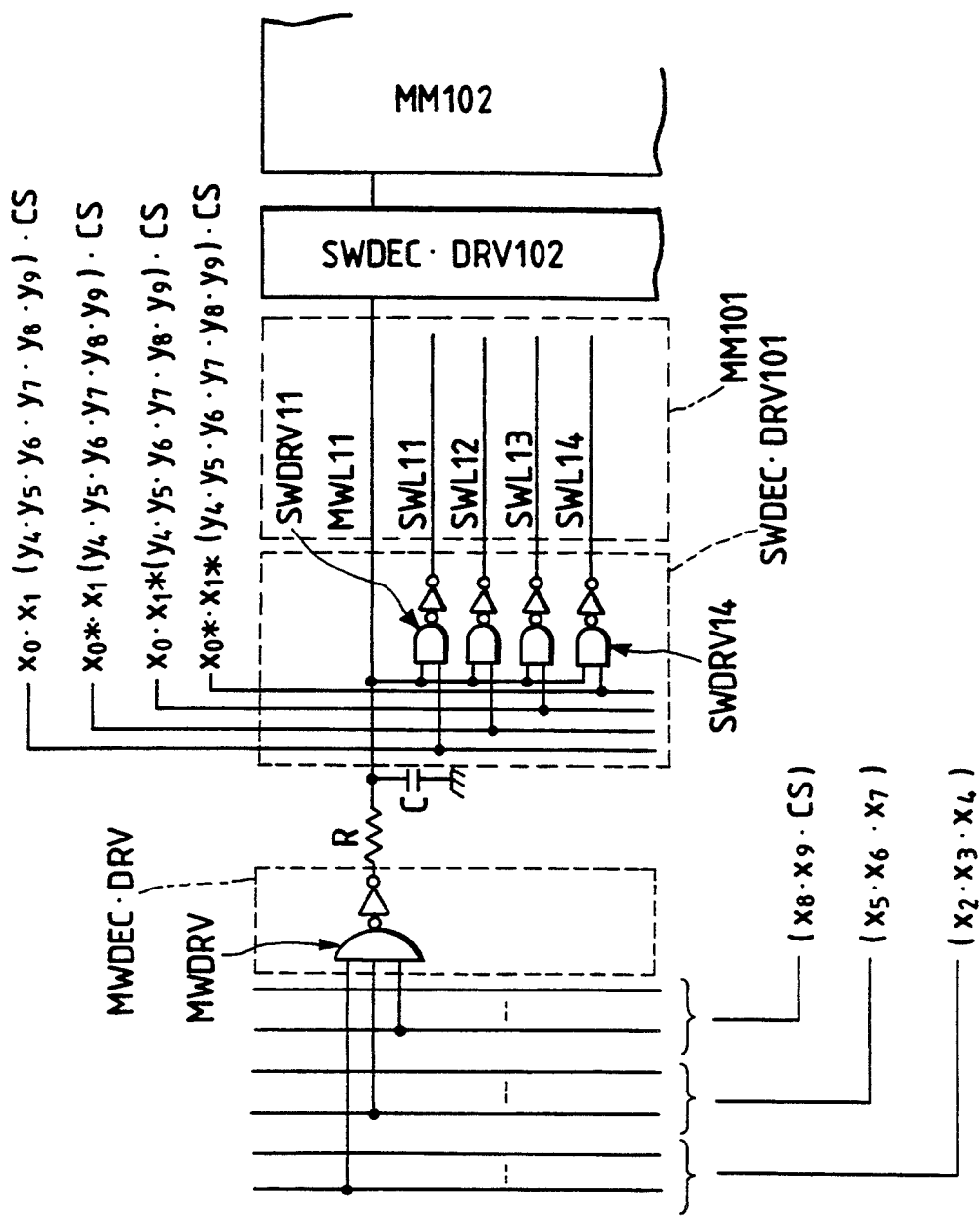
FIG. 5 is an explanatory diagram showing one example of the relations between a main word line and sub word lines.

As shown in FIG. 5, the driver MWDRV for driving one main word line MWL11 in the MWDEC·DRV is composed of a NAND·inverter gate and fed with a predetermined signal which is selected bit by bit from the 8-bit signal prepared by predecoding the x-address bits x2, x3 and x4; the 8-bit signal prepared by predecoding the x-address bits x5, x6 and x7; the 4-bit signal prepared by predecoding the x-address bits x8 and x9; and the signal CS. Incidentally, reference letter R appearing in the same Figure designates the resistance component of the main word line MWL11, and letter C designates the parasitic capacity component representatively. This main word line crosses all the memory mats contained in one memory array, and an undesired delay component composed of those resistance component R and capacity component C is larger than that of the sub word lines.

Figure 6:
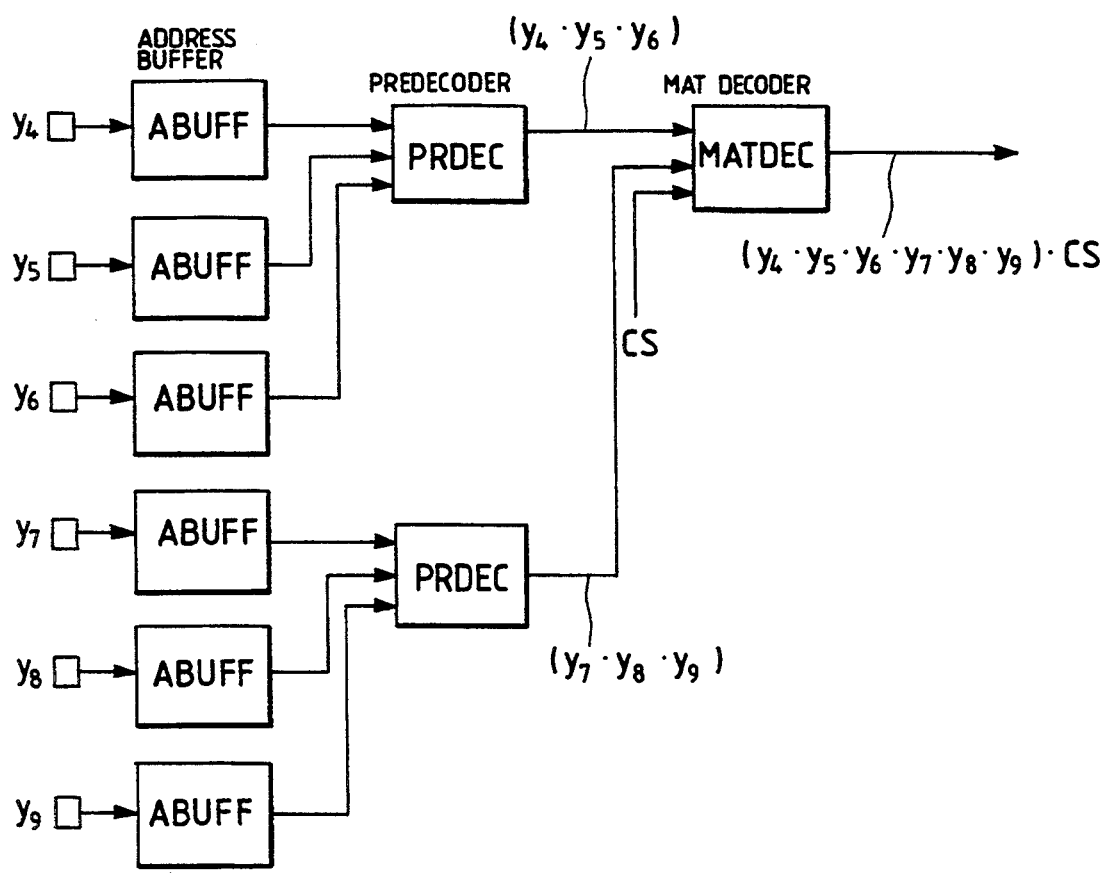
FIG. 6 is an explanatory diagram showing one example of a logic for forming a memory mat selecting y-address predecode signal.

FIG. 6 shows one example of the logic for forming the aforementioned memory mat selecting y-address predecode signal $(y4 \cdot y5 \cdot y6 \cdot y7 \cdot y8 \cdot y9)$. In FIG. 6, letters ABUFF designates an address buffer indicated at the unit of 1 bit; letters PRDEC designate a predecoder; and letters MATDEC designate a mat decoder. These address buffer ABUFF and predecoder PRDEC are exemplified in a circuit diagram in FIG. 12. The mat decoder MATDEC can be constructed, like the predecoder PRDEC, of an NAND gate and an inverter.

Figure 7:
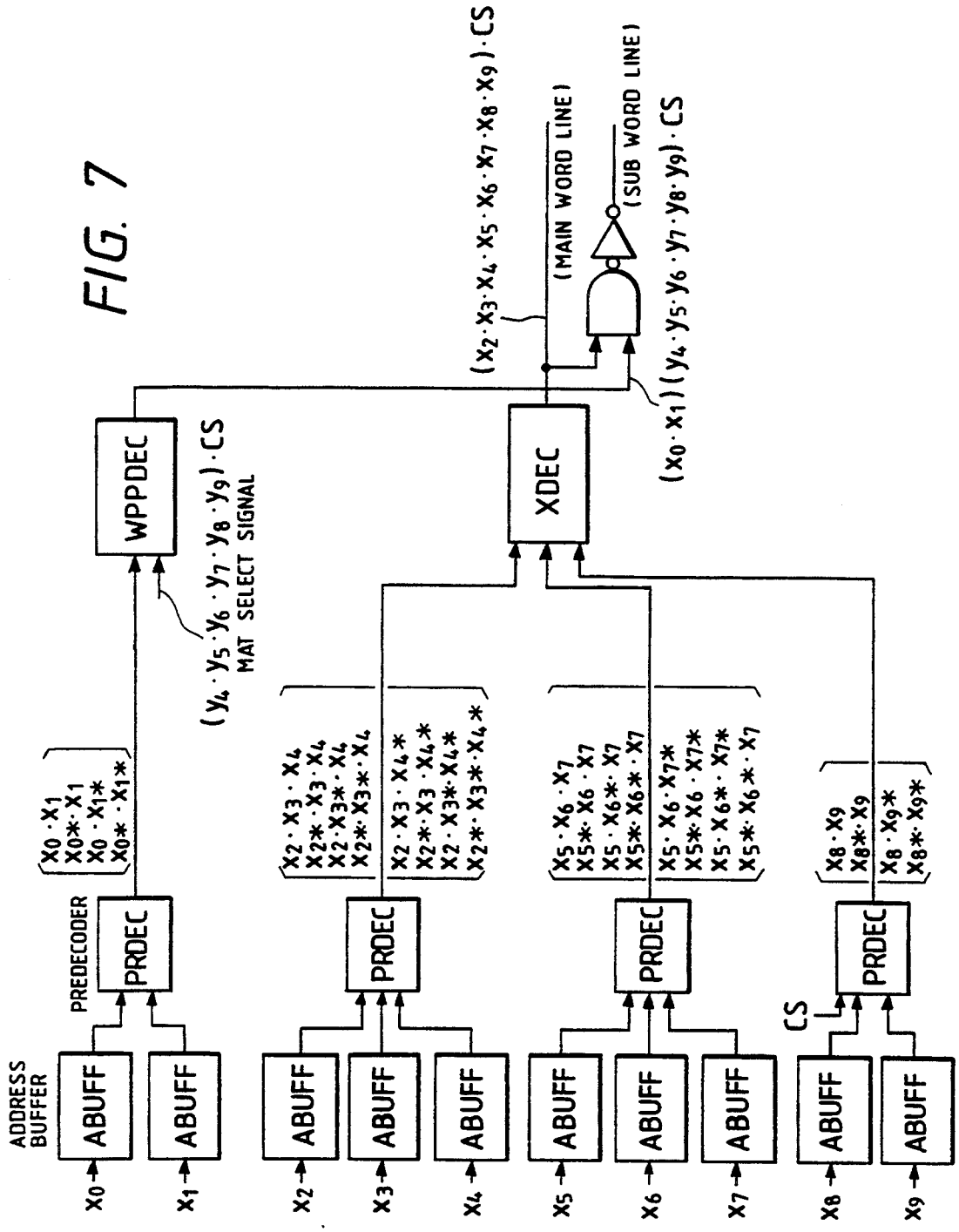
FIG. 7 is an explanatory diagram showing the detail of selecting systems of the sub word liners and the main word line and corresponding to FIG. 5.

FIG. 7 shows the detail of the selecting systems of the sub word lines and the main word line, as correspond to FIG. 5. The structure, as shown in the same Figure, is exemplified by a selecting system corresponding to the main word line MWL11 and the sub word line SWL11. The address buffer ABUFF and the predecoder PRDEC can adopt the circuit shown in FIG. 12(a) and 12(b), respectively. One input of the predecoder PRDEC corresponding to the address bits x8 and x9 is the signal CS. Letters WPRDEC designate a word predecoder which can adopt the circuit structure shown in FIG. 12(c). The X decoder XDEC can be constructed, like the predecoder PRDEC, of a NAND gate and an inverter.

The select drive circuit MWRDRV of the redundant main word line, as has been described with reference to FIG. 3, exemplifies level forcing for the main word line for the redundant memory cell, which is to be made to correspond by later-described save means, to the select level independently of the output of said save means, as shown in detail in FIG. 1. This circuit MWRDRV includes, although not especially limitative thereto, a fuse program circuit which is prepared: by connecting an n-channel MOSFET Q1 to be switched in response to the aforementioned chip select signal CS at its gate and a fuse FUS1 between a power terminal Vdd and a ground terminal GND; by providing an inverter INV1 made receptive of the level of the junction node for generating an inverted output; and by connecting between the input of the aforementioned inverter INV1 and the ground terminal Vss an n-channel MOSFET Q2 to be switched in response to the output of said inverter INV1 at its gate. There are further provided inverters INV2 and INV3 acting as a driver for amplifying the output of the aforementioned inverter INV1 thereby to drive the redundant main word line with the output of said inverter INV3. The redundant main word line is forced to a non-select level such as a low level, in the uncut state of the aforementioned fuse FUS1, and to a select level such as a high level in the cut state of the fuse FUS1. As a result, the redundant main word line to be used for replacing is driven to the select level without any logical operation such as the decode operation of the x-address if the chip select signal CS is set to the chip select level such as a high level. Incidentally, the fuse exemplifies the program link which can be fused with a laser in this embodiment.

For the memory cell areas MMN101 and MMN501 contained in the vertically corresponding memory mats MM101 and MM501 on the chip, according to FIG. 1, the memory mat select signals, as designated at (y4·y5·y6·y7·y8·y9), and the decode signals (x0·x1), (x0*·x1), (x0·x1*) and (x0*·x1*) as the sub word line select signals are commonly used as the signals for selecting the sub word lines (SWL11 - - -, and SWL51 - - -) contained in those memory cell areas. These signals are logically multiplied at the NAND·inverter gates AG11, AG14 and AG51, as representatively shown, and are fed as the select control signals to the drivers SWDRV11, SWDRV14 and SWDRV51 which are composed of the aforementioned corresponding NAND inverter gates, as representatively shown. The most significant bit x9 contained in the x-address signal for selecting the aforementioned main word line of FIG. 5 is deemed as one for instructing which of the upper or lower memory arrays arranged across the bonding pad BP is to be selected. As a result, even if the y-memory mat select signals (y4·y5·y6·y7·y8·y9) are fed commonly to the vertically paired memory mats, the main word line is driven to the select level for only one memory mat.

Figure 8:
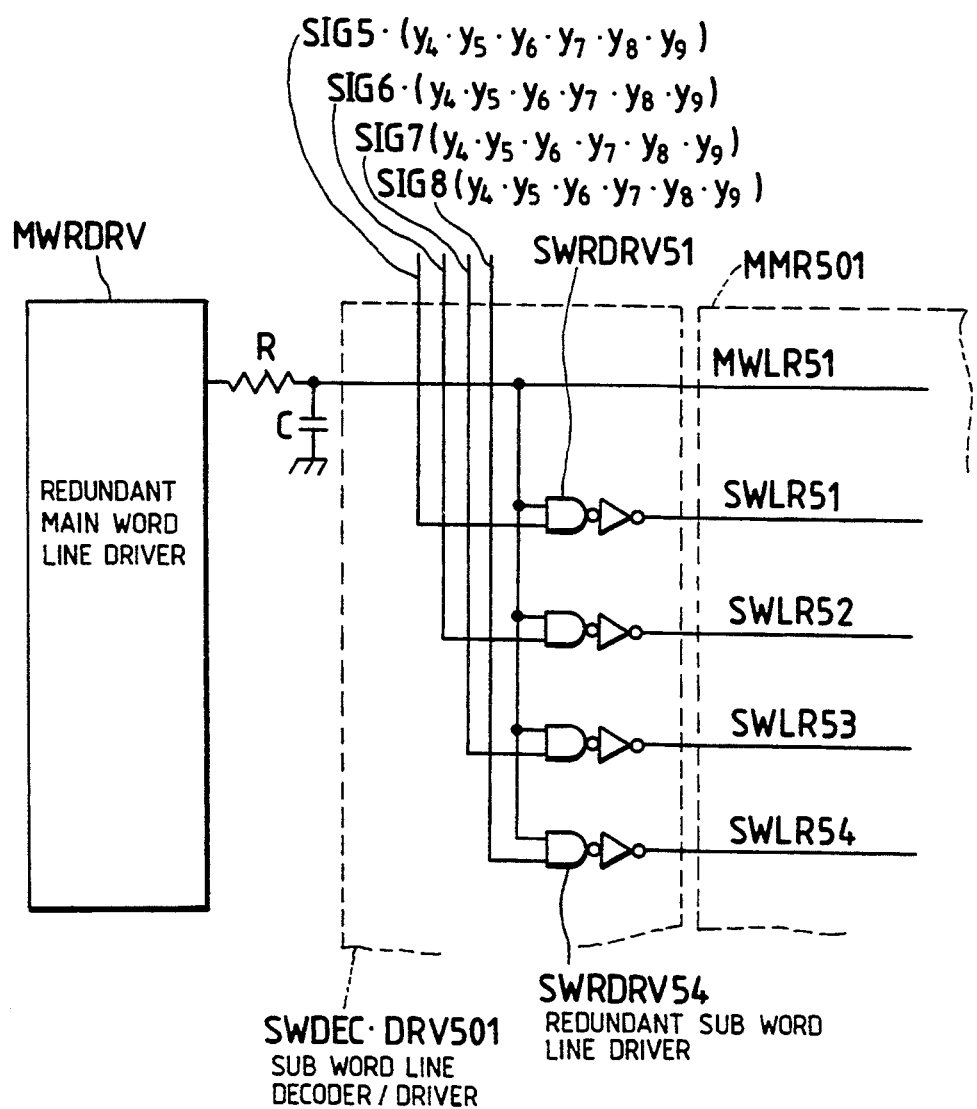
FIG. 8 is an explanatory diagram showing one example of the relations between a redundant main word line and redundant sub word lines.

For the redundant memory cell areas MMR101 and MMR501 contained in the vertically corresponding memory mats MM101 and MM501 on the chip in FIG. 1, on the other hand, the Y-memory mat select signal (y4·y5·y6·y7·y8·y9) of the aforementioned sub word lines, and the redundant select signals SIG1 to SIG4 and SIG5 to SIG8 deemed as signals for instructing which of the redundant memory cell area or any of the redundant sub word lines are used as the signals for selecting the sub word lines (SWLR11 - - -, and SWLR51 - - -) contained in those memory cell areas. These signals are logically multiplied at the NAND·inverter gates AGR11, AGR14 and AGR51, as representatively shown, and are fed as the select control signals to the drivers SWRDRV11, SWRDRV14 and SWRDRV51 which are composed of the aforementioned corresponding NAND inverter gates, as representatively shown. An example of this structure noting the redundant memory cell area MMR501 is shown in FIG. 8.

Figure 9:
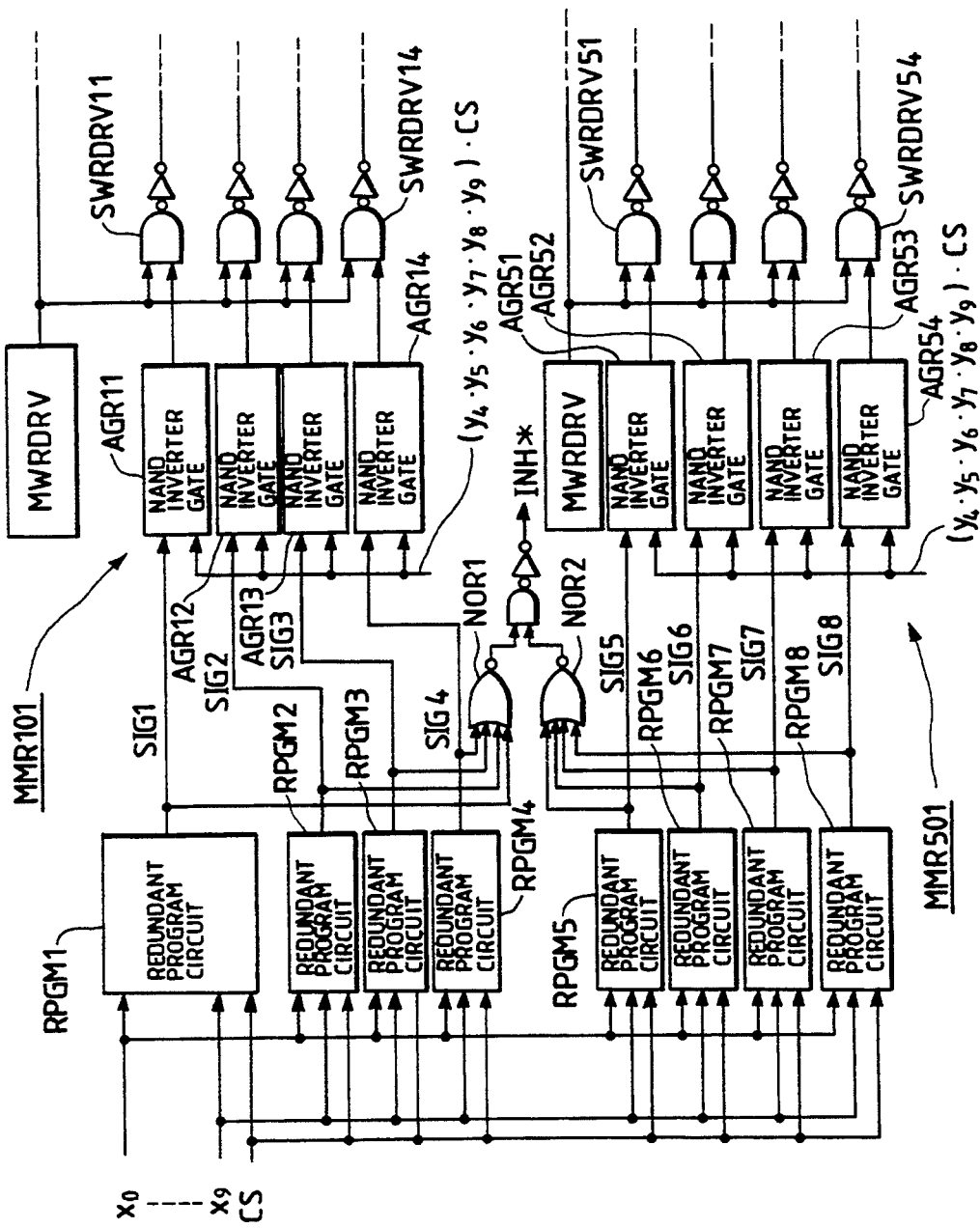
FIG. 9 is an explanatory diagram showing one example of the selecting systems of the redundant main word line and the redundant sub word lines.

FIG. 9 shows an example of the structure of the redundant program circuit for generating the redundant select signals SIG1 to SIG8 by noting the redundant memory cell areas MMR101 and MMR501. The redundant program circuits RPGM1 to RPGM8 are basically constructed to have an identical circuit.

Figure 10:
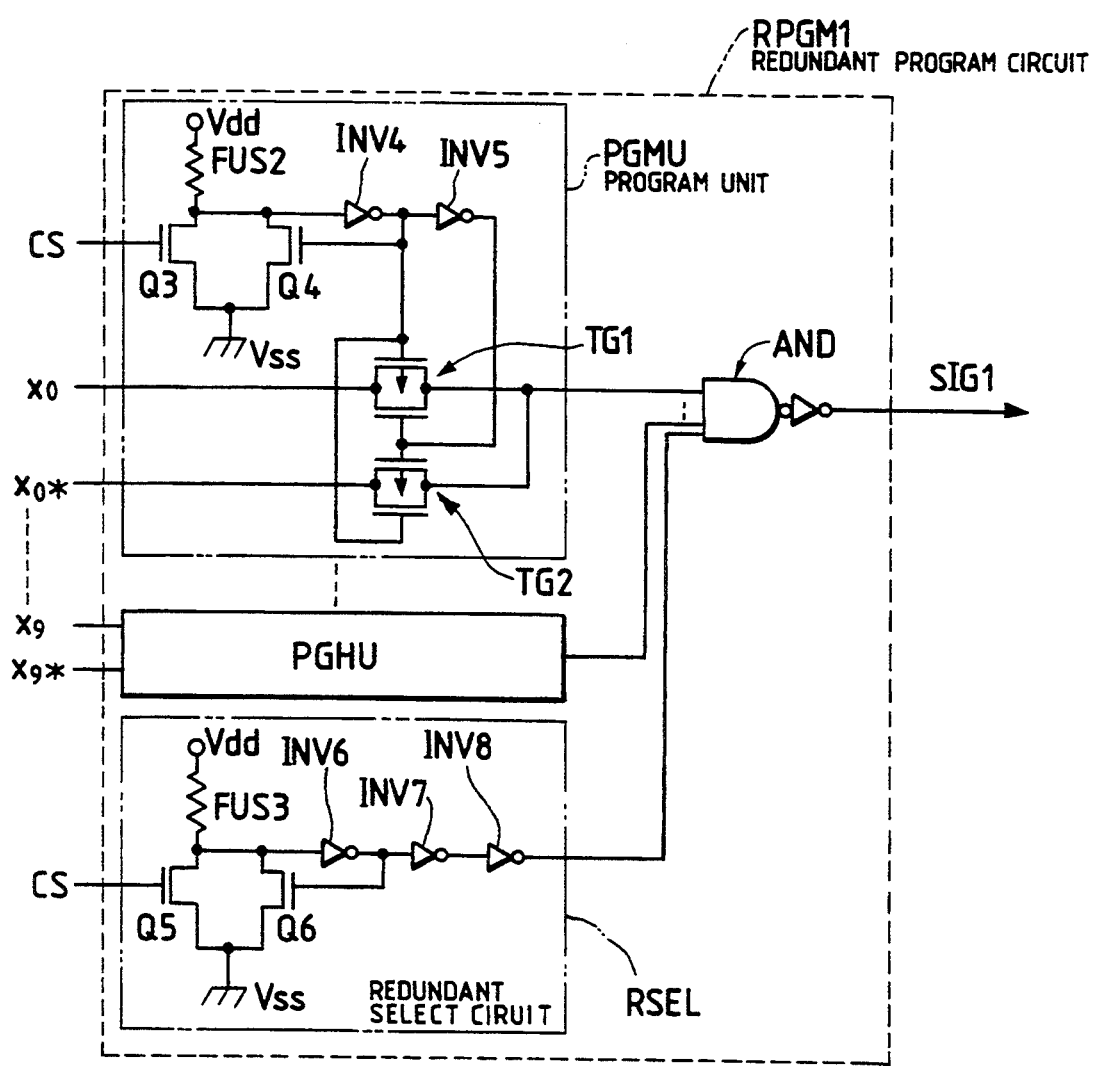
FIG. 10 is a circuit diagram showing one example of a portion of a redundant program circuit.

FIG. 10 shows a detailed example of the redundant program circuit RPGM1. This redundant program circuit RPGM1 is composed of ten program units PGMU which are made receptive of the 10-bit internal complementary address signals (x0, x0*) to (x9, x9*) of the x-system at the bit unit for programming which of the non-inverted or inverted complementary address bit is to be selected. Each of the program units PGMU is composed, although not especially limitative thereto, of a CMOS transfer gate TG1 arranged in the transmission passage of a non-inverted bit (e.g., x0), a CMOS transfer gate TG2 arranged in the transfer passage of an inverted bit (e.g., x0*) and a fuse program circuit for switching those CMOS transfer gates TG1 and TG2 complementarily. This fuse program circuit includes, although not especially limitative thereto, a fuse program circuit which is prepared by connecting an n-channel MOSFET Q3 to be switched in response to the aforementioned chip select signal CS at its gate and a fuse FUS2 between a power terminal Vdd and a ground terminal Vss; by providing an inverter INV4 made receptive of the level of the junction node for generating an inverted output; by connecting between the input of the aforementioned inverter INV4 and the ground terminal Vss an n-channel MOSFET Q4 to be switched in response to the output of said inverter INV4 at its gate; and by providing an inverter 5 made receptive of the output of the inverter INV4 for generating an inverted output. The output of this inverter INV4 is fed to the gates of the p-channel MOSFET (i.e., a transistor indicated by an arrow) of the CMOS transfer gate TG1 and the n-channel MOSFET (i.e., a transistor having no arrow) of the CMOS transfer gate TG2. The output of the aforementioned inverter INV5 is fed to the gates of the n-channel MOSFET of the CMOS transfer gate TG1 and the p-channel MOSFET of the CMOS transfer gate TG2.

In the non-cut state of the aforementioned fuse FUS2, the transfer gate TG1 is turned on whereas the transfer gate TG2 is turned off so that a non-inverted bit represented by x0 is selected and transmitted to the rear stage. In the cut state of the fuse FUS2, an inverted bit represented by x0* is selected and transmitted to the rear stage.

A circuit, as designated at RSEL in the redundant program circuit RPGM1, is a redundant select circuit which is composed, like the program unit PGMU, of a fuse FUS3, an n-channel MOSFETs Q5 and Q6 and inverters INV6, INV7 and INV8. This redundant select circuit RSEL is caused to output a signal at a high level by cutting the fuse FUS3 in advance, if a defective memory cell is to be replaced by the redundant memory cell.

In FIG. 10, the outputs of the ten program units PGMU and the output of the redundant select circuit RSEL are fed to a NAND/inverter gate AND so that they are logically multiplied to generate the aforementioned select signal SIG1. Thus, the x-address to be saved is programmed by programming the cut/uncut states of the fuses FUS2 and FUS3 so that all the inputs of the NAND/inverter gates AND may take a high level for the x-address signal to be saved. The remaining redundant program circuits RPGM2 to RPGM8 are similarly constructed to generate the aforementioned select signals SIG2 to SIG8. Of these, the select signals SIG1 to SIG4 are fed to a NOR gate NOR1, as shown in FIG. 9, and the select signals SIG5 to SIG8 are fed to a NOR gate NOR2. The outputs of the NOR gates NOR1 and NOR2 are fed to the AND gate AND composed of a NAND gate and an inverter to generate a save signal INH*. This save signal INH* is used to generate the aforementioned signals XS and XS*. As could be apparent from the generating logic of the save signal INH*, this signal INH* is given a high level at the access time (i.e., with the redundant memory cell being unselected), in which the redundant memory cell RMC is not selected for the memory access, and is given a low level at the access time (i.e., with the redundant memory cell being selected), in which the redundant memory cell RMC is selected.

Figures 11A, 11B:
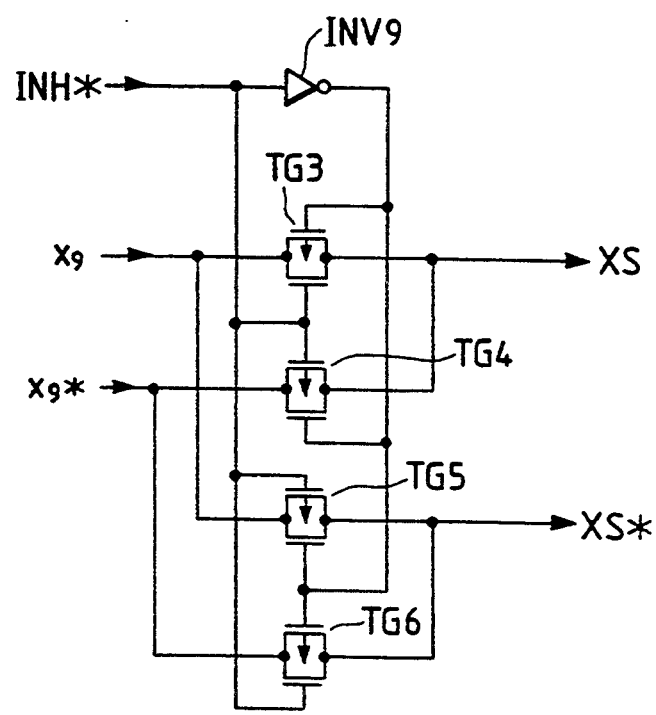
FIGS. 11(a) and 11(b) are an explanatory diagram and a table, respectively, showing one example of a change-over control circuit.

FIG. 11(a) shows one example of the switching control circuit for generating the aforementioned signals XS and XS* in accordance with the table shown in FIG. 11(b).

The circuit, as shown in the same Figure, is composed of the inverter INV9 and the CMOS transfer gates TG3, TG4, TG5 and TG8 and is made receptive of the most significant bits x9 and x9* of the x-address signal and the save signal INH*. This save signal INH* is given a high level at the non-selected access time of the redundant memory cell. At this time, the transfer gates TG3 and TG5 are turned on so that the select signal XS is set to the same logical level as the bit x9 whereas the select signal XS* is set to the same logical level as the bit x9*. According to the present embodiment, the bit x9 is deemed by its high level as a bit for instructing to select the memory array above the bonding pad BP in FIG. 3, and the bit x9* is deemed by its high level as a bit for instructing to select the memory array below the bonding pad BP in FIG. 3. As a result, at the non-selected access time of the redundant memory cell, the operation of either the data output buffer DOB1 or DOB2, as shown representatively in FIG. 1, is selected according to the logical levels of the internal complementary address bits x9 and x9* corresponding to the address signal fed from the outside. The save signal INH* is given a low level at the selected access time of the redundant memory cell. At this time, the transfer gates TG4 and TG6 are turned on so that the select signal XS is given the same logical level as that of the bit x9* whereas the select signal XS* is given the same logical level as that of the bit x9, to the contrary to the aforementioned non-selected access time of the redundant memory cell. As a result, at the redundant memory selected access time corresponding to the time, in which the access address is one to be saved by the redundant memory cell, the operation of the data output buffer (DOB2 or DOB1) at the side opposite to that of the redundant memory cell non-selected access time is selected.

Figure 13:
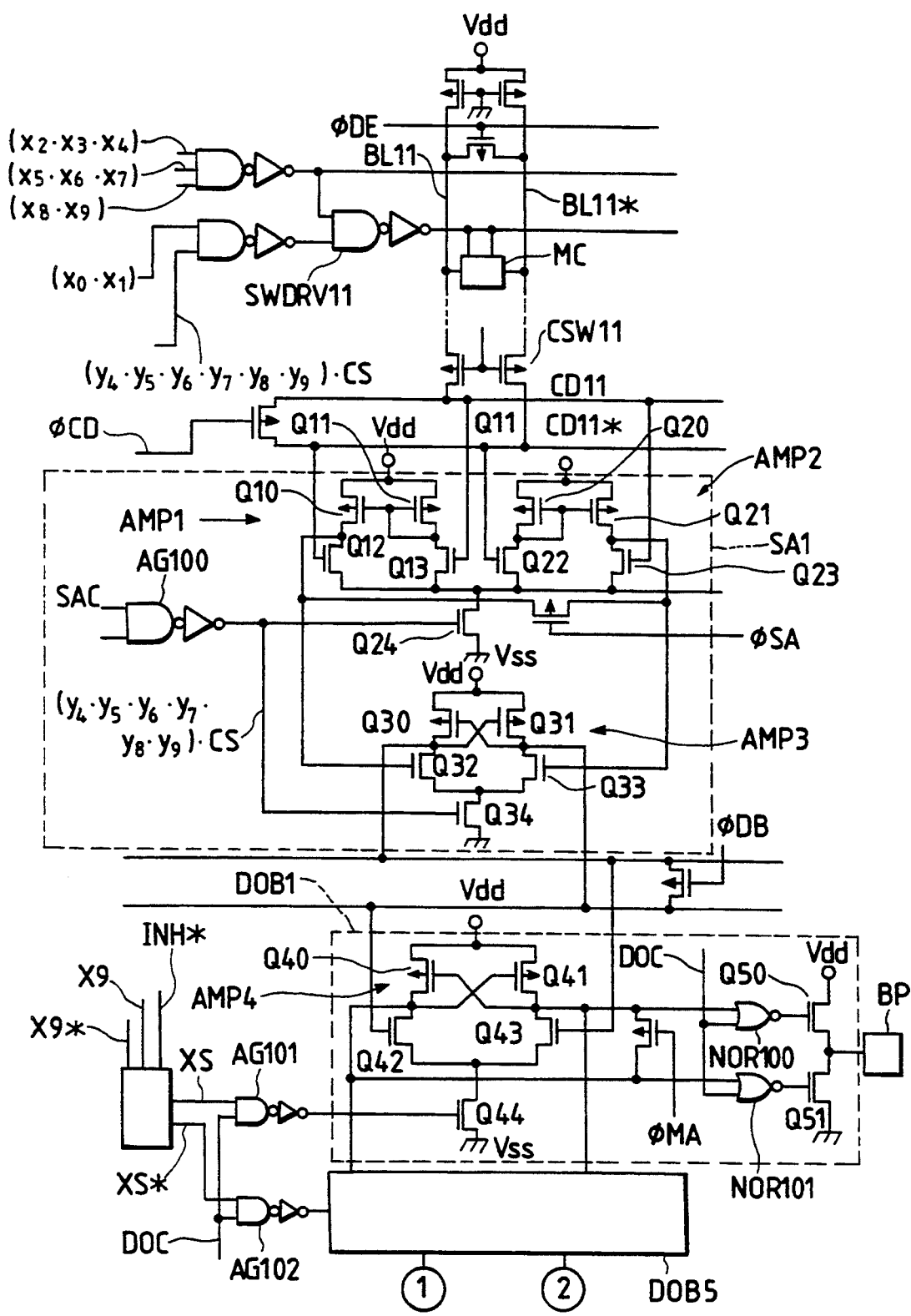
FIG. 13 is an explanatory diagram showing one front half of one example of the detailed circuit centering sense amplifiers SA1 and SA5 and data output buffers DOB1 and DOB5 shown in FIG. 1.
Figure 14:
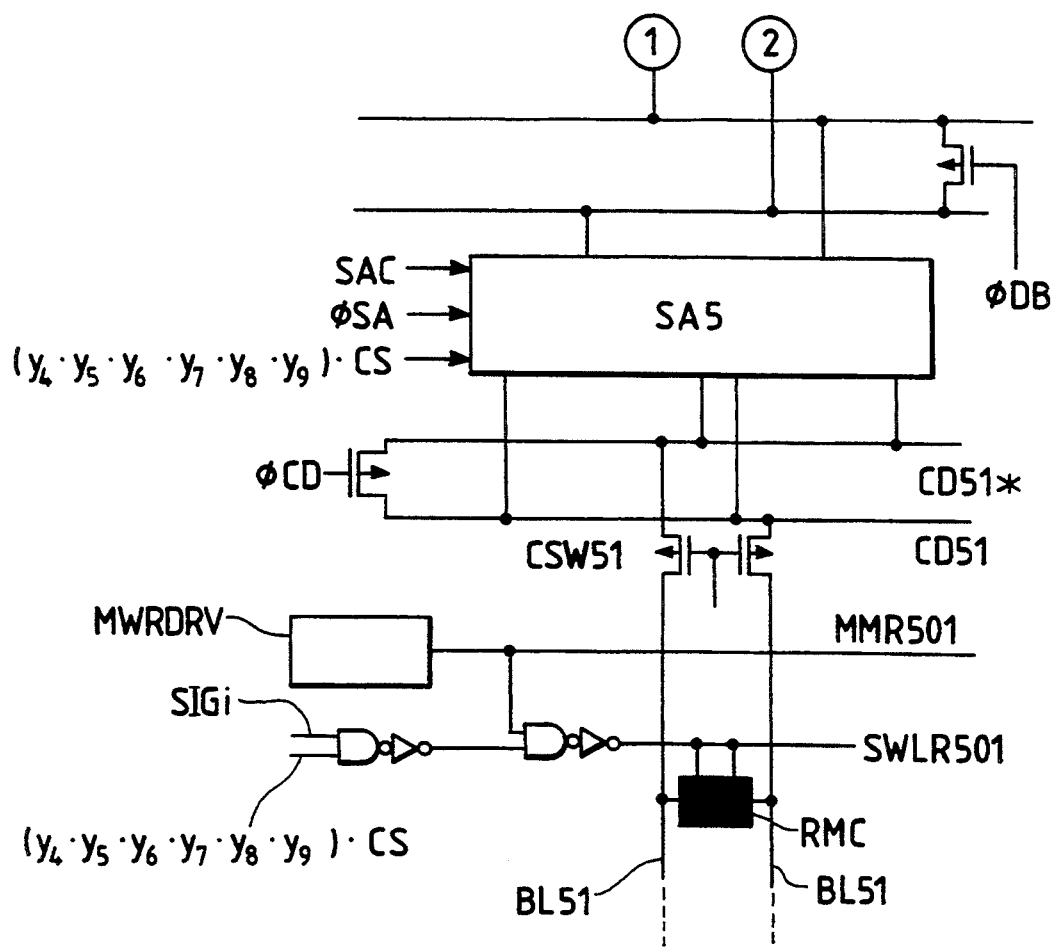
FIG. 14 is an explanatory diagram showing one rear half of one example of the detailed circuit centering the sense amplifiers SA1 and SA5 and the data output buffers DOB1 and DOB5 shown in FIG. 1.

FIGS. 13 and 14 show one detailed example of the circuit centering on the sense amplifiers SA1 and SA5 and the data output buffers DOB1 and DOB5, as shown in FIG. 1. Symbols ① and ② appearing in FIGS. 13 and 14 designate connection nodes, through which the same components in the circuits of the two Figures are coupled.

In FIG. 13, the sense amplifier SA1 is composed of: first and second differential amplifiers AMP1 and AMP2 for differentially amplifying the complementary level changes of the common data lines CD and CD*; and a third differential amplifier AMP3 for amplifying the individual single end outputs of the first and second differential amplifiers AMP1 and AMP2 as differential inputs. These first and second differential amplifiers AMP1 and AMP2 are activated if an N-channel power switch MOSFET Q24 is turned on, and the third differential amplifier AMP3 is activated if an N-channel power switch MOSFET Q34 is turned on. The aforementioned power switch MOSFETs Q24 and Q34 are controlled by the output of the AND gate AG100 which is made receptive of the sense amplification signal SAC and the aforementioned y-memory mat select signal (y4·y5·y6·y7·y8·y9)·CS. The sense amplification signal SAC is activated to a high level if a reading operation is instructed from the outside. Incidentally, the write amplifiers WA1 and WA5 shown in FIG. 1 are activated if a writing operation is instructed from the outside, although not shown.

The aforementioned differential amplifier AMP1 is equipped, although not especially limitative thereto, with: a current mirror load composed of P-channel MOSFETs Q10 and Q11; and a pair of N-channel differential input MOSFETs Q12 and Q13 having their drains connected with the same load and their sources connected commonly. The MOSFET Q12 has its gate connected with a common data line CD11*, and the MOSFET Q13 has its gate connected with the common data line CD11. Likewise, the aforementioned differential amplifier AMP2 is equipped, although not especially limitative thereto, with: a current mirror load composed of P-channel MOSFETs Q20 and Q21; and a pair of N-channel differential input MOSFETs Q22 and Q23 having their drains connected with the same load and their sources connected commonly. The MOSFET Q22 has its gate connected with a common data line CD11*, and the MOSFET Q23 has its gate connected with the common data line CD11. The aforementioned third differential amplifier AMP3 is equipped, although not especially limitative thereto, with N-channel differential inputs MOSFETs Q32 and Q33 having their sources commonly connected and their drains connected with the drains of the P-channel MOSFETs Q30 and Q31. The MOSFET Q30 has its gate coupled to the drain of the MOSFET Q33, and the MOSFET Q31 has its gate coupled to the drain of the MOSFET Q32. The input MOSFET 32 has its gate fed with the drain voltage of the MOSFET Q12, and the MOSFET Q33 has its gate fed with the drain voltage of the MOSFET Q23.

The data output buffer DOB1, as shown in FIG. 13, is equipped with a fourth differential amplifier AMP4 which is composed, like the aforementioned third differential amplifier AMP3, of P-channel MOSFETs Q40 and Q41 and N-channel MOSFETs Q42 and Q43. The fourth differential amplifier AMP4 is activated if an N-channel power switch MOSFET Q44 is turned on. Although not shown, the data output buffer DOB5 is also equipped with a fourth differential amplifier AMP4 like before and the power switch MOSFET Q44. The data output buffer DOB1 is activated by the high level output of the AND gate AG101, and the data output buffer DOB5 is activated by the high level output of the AND gate AG102. The AND gate AG101 is fed with the signal XS generated according to the logic described with reference to FIG. 11 and the data output control signal DOC, to output a high level signal if the two inputs are at a high level. The AND gate AG102 is fed with the signal XS* generated according to the logic described with reference to FIG. 11 and the data output control signal DOC, to output a high level signal if the two inputs are at a high level. The data output control signal DOC is one which is set to a high level in accordance with an instruction of a data reading operation from the outside. Incidentally, the data input buffers DIB1 and DIB5, as shown in FIG. 1, are activated and controlled in response to the data input control signal, which is activated in accordance with the writing operation instructed from the outside, and the aforementioned signals XS and XS*.

NOR gates NOR100 and NOR101 contained in the data output buffer DOB1 and N-channel output MOSFETs Q50 and Q51 connected in series with the power terminal Vdd and the ground terminal Vss constitute an output stage altogether. This output stage is shared with the data output buffer DOB5 which makes a pair with the data output buffer DOB1.

Figure 15:
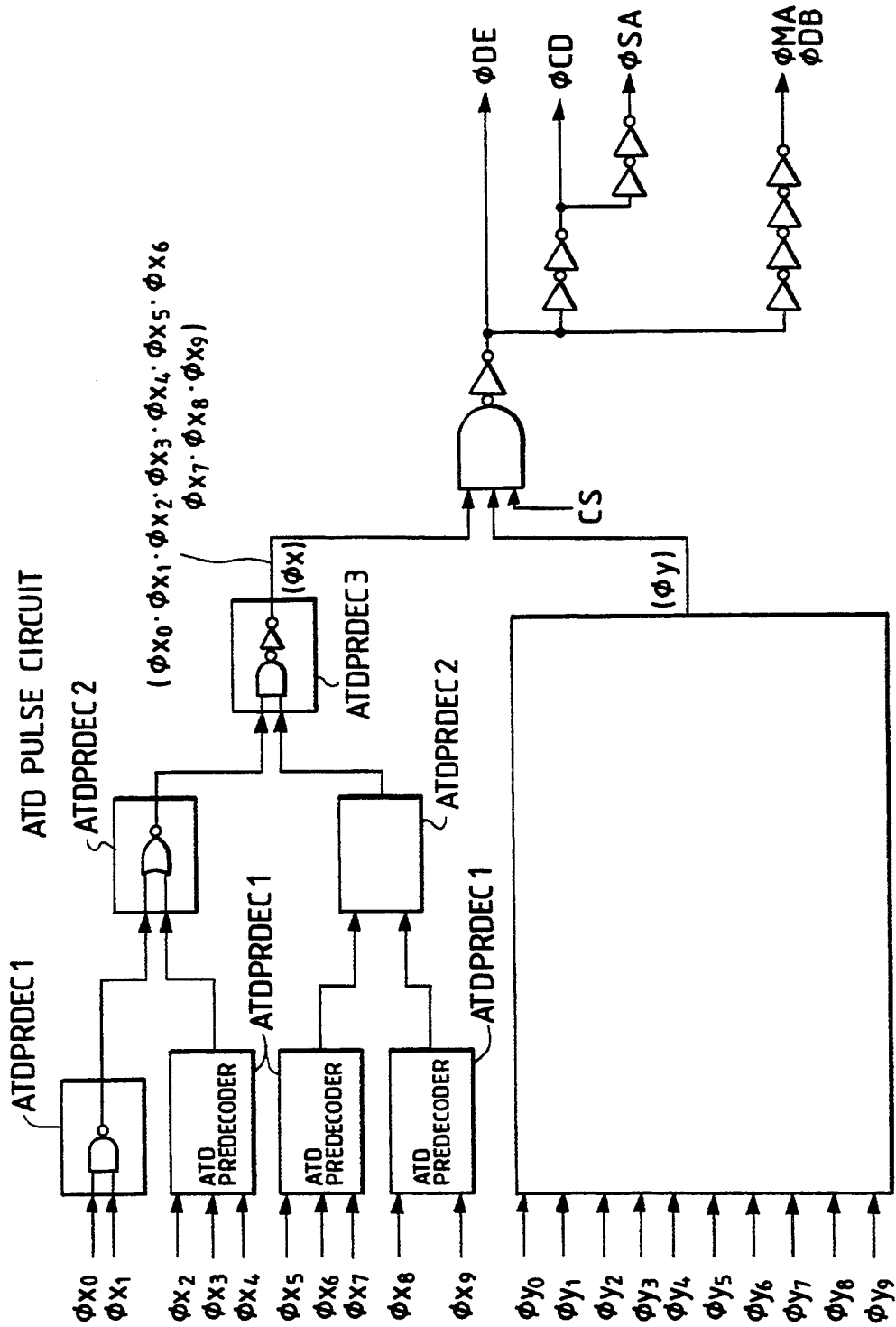
FIG. 15 is a circuit diagram showing one example of an ATD pulse circuit.

Signals $\phi$ DE, $\phi$ CD, $\phi$ SA, $\phi$ DB and $\phi$ MA appearing in FIGS. 13 and 14 are timing signals which are generated by the ATD pulse circuit shown in FIG. 15 and which have their levels changed sequentially at a predetermined timing in synchronism with the change in the address signal. Those signals $\phi$ DE, $\phi$ CD, $\phi$ SA, $\phi$ DB and $\phi$ MA are used to equalize the predetermined nodes of the data lines, the common data lines, the sense amplifiers and the data output buffers, while they are inoperative, thereby to initialize them to operationally desirable levels. Incidentally, letters $\phi$ x0, - - - , $\phi$ x9, and $\phi$ y0, - - - , $\phi$ y9 appearing in FIG. 15 designate individual address bits outputted from the address buffers. In FIG. 15: an ATD predecoder ATDPRDEC1 is composed of a NAND gate; an ATD predecoder ATDPRDEC2 is composed of a NOR gate: and an ATD predecoder ATDPRDEC3 is composed of an AND gate of a NAND gate and an inverter. Although not especially shown, the circuit block at the side of the address bits $\phi$ y0, - - - , $\phi$ y9 is likewise composed of the aforementioned ATD predecoder ATDPRDEC1, ATDPRDEC2 or ATDPRDEC3.

Next, the operations of the embodiment thus constructed will be described in the following.

In case the memory cell MC (i.e., the memory cell, as indicated by symbol X in FIG. 1) in the memory cell area MMN501 of the memory mat MM501 of the same Figure is defective, the redundant memory cell RMC (i.e., the redundant memory cell, as indicated in solid) of the redundant memory cell area MMR101 contained in the memory mat MM101 at the opposite side is assigned to replace the defective memory cell. For this, the fuse FUS1 contained in the select drive circuit MWRDRV for the redundant main word line MWLR11 shown in FIG. 1 is cut in advance, and the fuse FUS2 in the program units PGMU contained in the redundant program circuit RPGM1 shown in FIG. 10 is cut together with the fuse FUS3 in accordance with the address of the defective memory cell to be replaced. The chip of the static RAM thus redundantly programmed is packaged in the LOC shape, as shown in FIG. 2.

On the system in which the redundantly programmed static RAM is installed, this static RAM is activated if it is instructed to select the chip from the outside so that the chip select signal CS is asserted as the internal control signal to a high level. At this time, in the present embodiment, the select drive circuit MWRDRV of the redundant main word of FIG. 1 is activated so that the redundant main word line MWLR11 to be used for replacing the defective memory cell is driven to the select level such as a high level. Moreover, the redundant program circuits RPGM1 to RPGM8 are activated. If the access address from the outside is the aforementioned address of the defective chip replaced, the main word line MWL51 of the memory mat MMN501 is driven to the select level. Simultaneously with this, the sub word line SWL51 is driven to the select level by the sub word driver SWDRV51 in accordance with that drive signal, the aforementioned predecode signal (X0·x1) and mat select signal (y4·y5·y6·y7·y8·y9)·CS. This sub word line SWL51 is coupled to the select terminal of the defective memory cell MC to be replaced. As to the selection of the redundant memory cell RMC to be used for replacing the defective memory cell, on the other hand, the redundant main word line MWLR11 is driven in advance to the select level by the select drive circuit MWRDRV, so that the redundant sub word line SWLR11 is driven to the select level by the redundant sub word driver SWRDRV11 in accordance with that drive signal, the aforementioned mat select signal (y4·y5·y6·y7·y8·y9)·CS and the redundant select signal SIG1 outputted from the redundant program circuit RPGM1. The select terminal of the redundant memory cell RMC to be used for saving is coupled to that redundant sub word line SWLR11.

Thus, in case of the access to the address of the defective memory cell, to be the defective memory cell MC of the memory cell area (MMN501) contained in one (MM501) of the vertically paired memory mats is selected in parallel with the redundant memory cell RMC of the redundant memory cell area (MMR101) contained in the other memory mat (MM101). At this time, the redundant main word line MWLR11 for selecting the redundant memory cell RMC is driven by the select drive circuit MWRDRV which was programmed by cutting the fuse 1, and this driving operation does not require any logical operation to decide whether or not the access address fed from the outside is the defective memory cell address to be replaced by the redundant memory cell. As a result, the drive start timing of the redundant main word line (MWLR11) is not delayed in the least from the drive start timing of the main word line (MWL51). As a result, it is possible to completely prevent such an even that the select drive timing of the redundant sub word line is delayed on account of the delay in the drive timing of the redundant main word line. Incidentally, the logical operation of the redundant program circuit RPGM1, as shown in FIG. 10, is executed in parallel with the predecode operation for generating the mat select signal (y4·y5·y6·y7·y8·y9). This would be apparent from the circuit structure of FIGS. 10 and 6.

The data of the memory cell MC selected by the aforementioned memory mat MM501 are read through the complementary bit lines BL51 and BL51* and the column select switch circuit CSW51 to the complementary common data lines CD51 and CD51* so that they are amplified by the sense amplifier SA5 and fed to the output buffer DOB5. Likewise, the data of the redundant memory cell RMC selected by the aforementioned memory mat MM101 are read through the complementary bit lines BL11 and BL11* and the column select switch circuit CSW11 to the complementary common data lines CD11 and CD11* so that they are amplified by the sense amplifier SA1 and fed to the output buffer DOB1. Since, at this time, the redundant select signal SIG1 is at the high level, the save signal INH* in the circuit of FIG. 9 is asserted to the low level. As a result, the relations between the most significant address bits x9 and x9* of the x-system and the select signals XS and XS* are logically inverted to select the output operation of the output buffer DOB1 at the side of the memory mat MM101. Thus, the data of the redundant memory cell RMC for replacing the defective memory cell are outputted to the outside through the bonding pad BP. In case the access address is one needing no replacing, the save signal INH* is negated to the high level so that the read data are selected from the memory cell area.

FIG. 16 shows the operation timing of the static RAM according to the present embodiment and presents a timing chart at (A) when a memory cell MC is selected and a timing chart at (B) when a redundant memory cell RMC is selected. If the timings of (A) and (B) of the same Figure are compared, the assert timing of the redundant select signal SIG1 of (B) is delayed by a time Td from the output decision timing of the word predecoder WPRDEC of (A). This is because the number of logical steps for generating the redundant select signal is slightly more. On the other hand, the select level of the main word line MWL51 of (A) is determined, if the decode operation of the input address signal is decided, and the level of the redundant main word line MWLR11 of (B) is decided to the select level such as the high level in accordance with the chip select state of the signal CS. As a result, the select level decide timing of the redundant sub word line SWLR11 is not delayed so much, as compared with the select timing of the sub word line SWL51. According to FIG. 16, the select level decide timing of the redundant sub word line SWLR11 is slightly accelerated from the select timing of the sub word line SWL51. Accordingly, the read data output timing of the redundant memory cell RMC from the output buffer DOB1 of (B) is slightly accelerated from the read data output timing of the memory cell MC from the output buffer DOB5 of (A).

Figure 17:
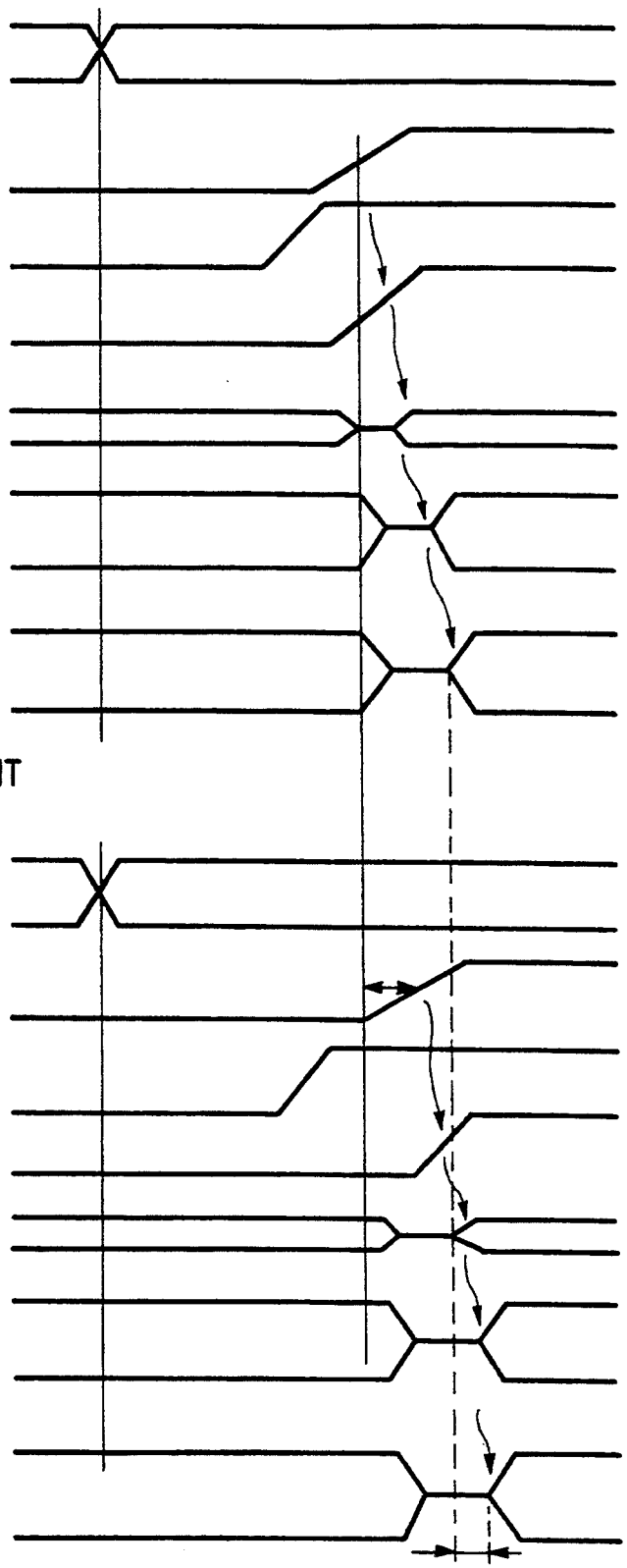
FIG. 17 shows the operation timing of one example of the static RAM, which adopts a circuit for forming a select signal of a redundant main word line through a circuit for programming the address of a defective memory cell with a fuse, and presents a timing chart at (A) when the memory cell is selected and a timing chart at (B) when the redundant memory cell is selected.

FIG. 17 shows the operation timing of one example of the static RAM, which adopts a circuit for forming a select signal of a redundant main word line through a circuit for programming the address of a defective memory cell with a fuse, and presents a timing chart at (A) when the memory cell is selected and a timing chart at (B) when the redundant memory cell is selected. If the timings of (A) and (B) of the same Figure are compared, the select level decide timing of the redundant main word line of (B) is far more delayed than the select level decide timing of the main word line of (A). This is because the select signal of the redundant main word line has to be generated through the circuit for programming the address of the defective memory cell with the fuse, so that the number of logical steps therefor is far larger than the logical step number for selecting the main word line. This difference seriously delays the read data output timing of the redundant memory cell from the output buffer.

Figure 18:
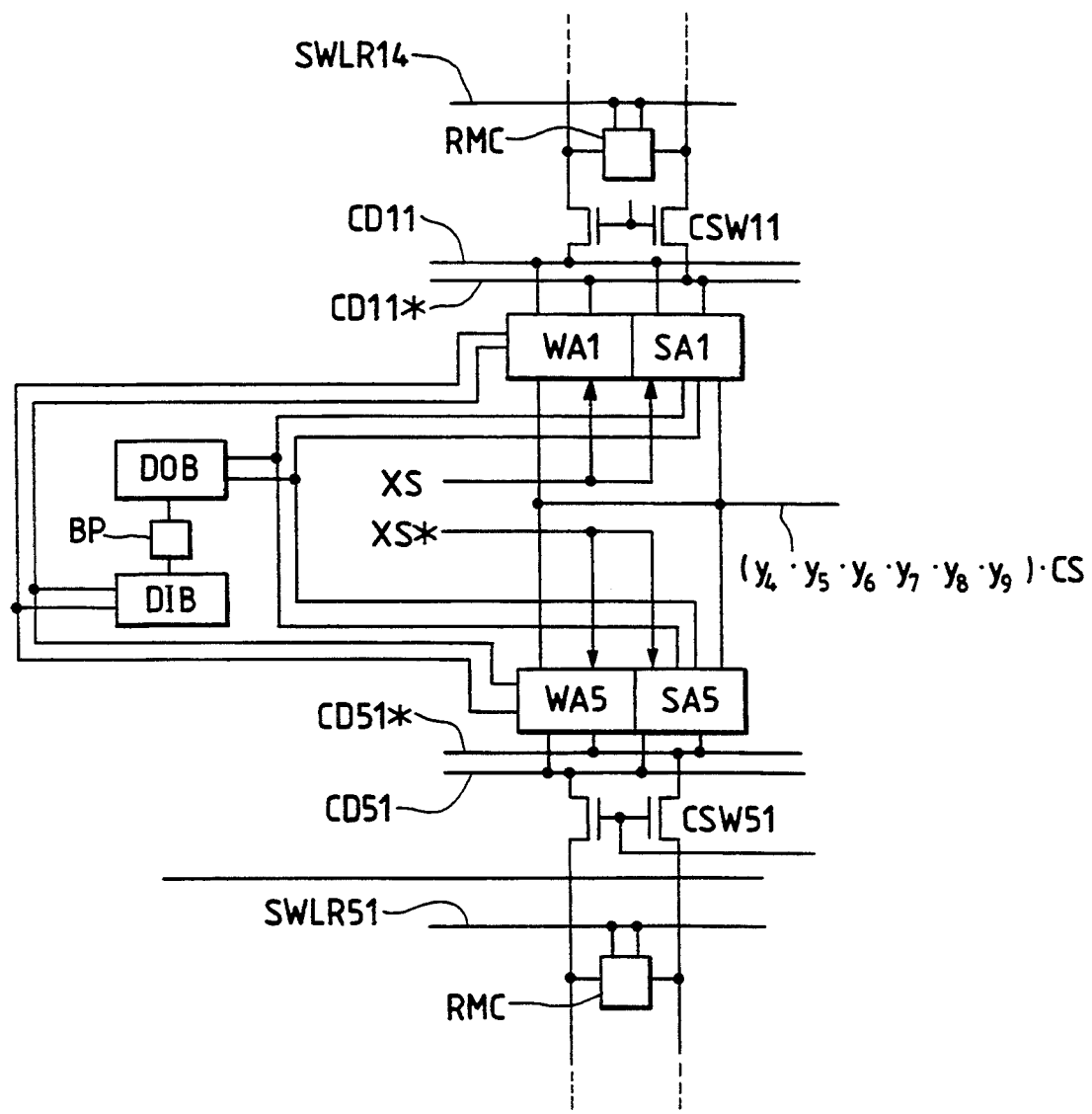
FIG. 18 is a block diagram showing an essential portion of an embodiment for controlling a sense amplifier and a write amplifier in response to signals XS and XS*.

FIG. 18 shows an embodiment for controlling the sense amplifier and the write amplifier with the aforementioned signals XS and XS*. In the embodiment shown in FIG. 1, both the sense amplifiers SA1 and SA5 are activated in the data reading operation so that either of their outputs is selected and outputted to the outside by the data output buffer DOB1, which is activated and controlled by the signal XS, and the data output buffer DOB5 which is activated and controlled by the signal XS*. In the structure of FIG. 18, on the contrary, either of the sense amplifiers SA1 and SA5 is activated and controlled in the data reading operation in accordance with the signals XS and XS*. Specifically, the AND gate AG100 of the sense amplifier SA1 shown in FIG. 13 is changed into three-input type and fed with the signal XS, and the sense amplifier SA5 shown in FIG. 14 is fed with the signal XS*. Moreover, both the sense amplifiers SA1 and SA5 are commonly provided with the data output buffer DOB. The data input buffer DIB and the write amplifiers WA1 and WA5 arranged at the input system of data are similarly constructed. The remaining structure is similar to that of the embodiment having been described with reference to FIG. 1, and its detailed description will be omitted.

In case of the embodiment shown in FIG. 18, either of the sense amplifiers of the memory mats vertically paired on the chip is activated in accordance with the signals XS and XS* so that a contribution to a lower power consumption than the structure of FIG. 1 is obtained. In the structure of FIG. 1, on the contrary, in case of the access to the address of a defective memory cell to be replaced, the defective memory cell of the memory cell area contained in one of the vertically paired memory mats of the chip is selected in parallel with the redundant memory cell of the redundant memory cell area contained in the other memory mat. Then, the selection of the data to be read-out of the two memory mats is accomplished by the output buffer at the terminal end of the output system. Even if the select timing of the redundant memory cell should be delayed from the select timing of the memory cell, the delay could be offset by the operation spare time of another circuit. FIGS. 18 and 1 will be further investigated by noting the difference in the circuit constituting transistors. In case the static RAM is constructed of the CMOS circuit, for example, predetermined complementary signal lines such as data lines or common data lines may be equalized in advance to operationally desirable levels to constitute the circuit. In this structure, the time is considerably consumed for the circuit operation for the equalization, such as the operations of the equalizing transistors controlled by the timing signal generated in the ATD pulse circuit or for the timing margin, so that the access speed is accordingly delayed. In this case, the time spare is increased till the output of the sense amplifier is decided, no matter how long the time for selecting the redundant memory cell might be. As a result, an equal access time can be easily warranted no matter which of the redundant memory cell or the memory cell might be selected, even if the read data are selected at the terminal end of the data reading system such as the data output buffer. In this case, it is advisable for economy of power consumption to adopt the structure shown in FIG. 18. In case, on the other hand, the static RAM is constructed of a BI-CMOS circuit, the event that the data are undesirably inverted can be prevented without any equalization because an amplifier such as the sense amplifier has a high drivability, and the operations are often speeded up totally. Thus, it is considered advisable to select the read data at the terminal end of the data read system such as the data output buffer, as shown in FIG. 1.

Figure 19:
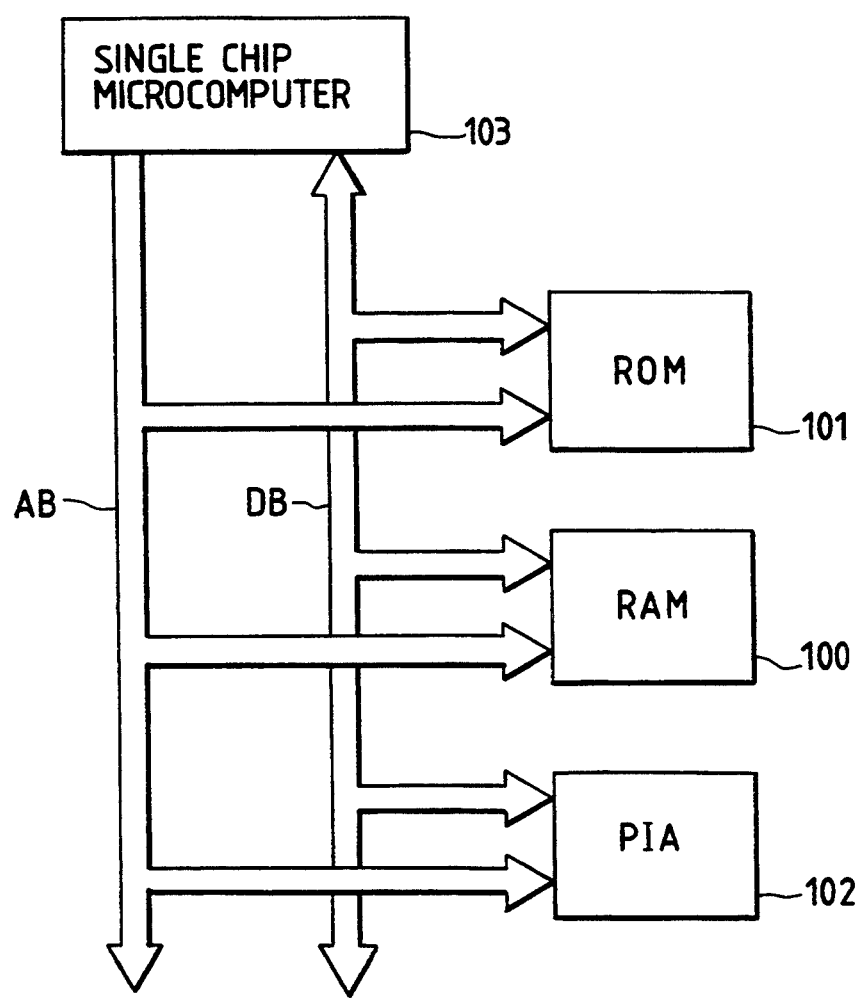
FIG. 19 is a block diagram showing one example of a microcomputer system using a RAM according to one embodiment of the present invention.

FIG. 19 shows a microcomputer equipped with a RAM according to the present invention. With the external address bus AB and the external data bus DB, there are connected peripheral devices such as dynamic or static RAM 100, ROM 101 or PIA (i.e., Peripheral Interface Adapter) 102 according to the present invention. These peripheral devices and a single chip microcomputer 103 constitute together a microcomputer system.

The following operational effects can be obtained from the embodiments thus far described. (1) In case of an address to access a defective memory cell to, a defective memory cell in the memory cell area contained in one of the vertically paired memory mat is selected in parallel with a redundant memory cell in the redundant memory cell area contained in the other memory mat. At this time, the redundant main word line for selecting the redundant memory cell is driven by the drive circuit MWRDRV which was programmed by cutting the fuse FUS1, thus making the logical operation unnecessary for deciding whether or not the redundant use of the access address fed from the outside is proper. As a result, the drive start timing of the redundant main word line is not delayed in the least from the drive start timing of the main word line. Thus, it is possible to completely prevent the event that the select drive timing of the redundant sub word line is delayed on account of the delay in the drive timing of the redundant main word line.

(2) Thanks to the foregoing effect, it is possible to suppress an increase in the access time for the redundant memory cell and to warrant an equal access speed irrespective of the presence or absence of the redundantly replaced memory cell.

(3) In case of an address to access a defective memory cell, a defective memory cell in the memory cell area contained in one of the vertically paired memory mat is selected in parallel with a redundant memory cell in the redundant memory cell area contained in the other memory mat. At this time, the data read out of the two memory mats are selected by the output buffer so that the delay, if any, of the select timing of the redundant memory cell from the select timing of the memory cell can be offset by the operation spare time of another circuit. A contribution to the lower power consumption can be obtained if such selection is accomplished by the selective activation control of the sense amplifier, as has been described with reference to FIG. 18.

(4) In case the LOC system is adopted, the memory mats have to be vertically divided and arranged across the bonding pad in accordance with the characteristics of the LOC system, so that the aforementioned structure an be achieved relatively simply.

(5) Since the redundant memory cell area is arranged close to the center portion of the bonding pad, the transmission passage of the data from the redundant memory cell can be made shorter than the longest one so that the access time of the redundant memory cell can be further shortened.

Although our invention has been specifically described in connection with the embodiments thereof, it should not be limited thereto but can naturally be modified in various manners without departing from the gist thereof. For example, the foregoing embodiments have been described by taking the LOC type chip as an example, but the present invention should not be limited thereto but can be modified such that the bonding pad is arranged in the peripheral edge of the chip. Moreover, the number of memory arrays and the number of divided memory mats should not be limited to those of the embodiments but can be suitably changed. Still moreover, the selecting operations of the memory cell to be replaced may be either inhibited through a suitable logic or interrupted in its course.

In the foregoing description, our invention has been described mainly in case it is applied to the static RAM. However, the present invention should not be limited thereto but can be applied to a dynamic RAM or a quasi-static RAM. Moreover, the device of the present invention can be installed on a single chip microcomputer having a built-in central processing unit so that it may be applied to either the operation area of the central processing unit or a temporary storage area of data. The present invention can be applied to at least the device which is conditioned to have the divided word line structure.

The effects to be achieved by the representatives of the invention disclosed herein will be briefly described in the following.

Specifically, for a plurality of memory mats having the divided word line structure equipped with a main word line and sub word lines, the redundant main word line for a redundant memory cell made to correspond by the redundant program means for causing the address of the defective memory cell in the memory cell in one memory mat to correspond electrically to the address of the redundant memory contained in the other memory mat is forced to the select level independently of the output of said redundant program so that the redundant main word line can be driven to the select level without awaiting the decision of the logical operation for deciding whether or not the access address is one to be used for replacing. As a result, it is possible to suppress an increase in the access time to the redundant memory cell.

Since the redundant main word line forced to the select level is associated with a memory mat other than that of the main word line of the defective memory cell that does correspond directly to the access address, it is possible to drive the redundant main word line and the main word line of the memory cell in parallel with each other to the select level. Especially in case the LOC type is adopted, the memory mats accordingly have to be vertically divided and arranged across the externally connected electrodes such as the bonding pad. However, this structure can be achieved relatively easily.

In case the LOC structure is adopted, moreover, the transmission passage of the data from the redundant memory cell can be made shorter than the longest one from the memory cell area by arranging the redundant memory cell area close to the center portion near the externally connected electrodes. Thanks to this point, it is also possible to shorten the access time of the redundant memory cell.

Furthermore, the memory cells are selected in parallel in both one memory mat having the defective memory cell to be replaced and the other memory mat containing the redundant memory cell to be used for the replacing, and the data selected at both the memory mats are then selected and outputted to the outside by the data output buffer at the terminal end of the data reading system. Thus, even if the select timing of the redundant memory cell should be delayed from the select timing of the memory cell, this delay could be offset by the operation spare time of another circuit. Thanks to this point, it is also possible to shorten the time for accessing to the redundant memory cell. If this selection is to be accomplished by the sense amplifier at a front stage of the output buffer, it is sufficient for the two memory mats to share the data output buffer and for the two sense amplifiers to be selectively activated. Thus, a contribution can be obtained to the low power consumption.

Thanks to the foregoing effects, there can be attained an effect that an equal access speed can be warranted irrespective of the presence or absence of the memory cell to be replaced by the redundant memory cell.

What is claimed is:

1. A semiconductor memory device comprising:
a memory cell having an address and a redundant memory cell, each having a select terminal and providing data read out;
a main word line for said memory cell;
a sub word line corresponding to said main word line and coupled to the select terminal of said memory cell;
sub word drive means for driving said sub word line on the basis of a signal to be transmitted to said main word line and a sub word select signal;
a redundant main word line for said redundant memory cell;
a redundant sub word line corresponding to said redundant main word line and coupled to the select terminal of said redundant memory cell;
redundant sub word line drive means for driving said redundant sub word line on the basis of a signal to be transmitted to said redundant main word line and a redundant select signal;
address compare means for comparing the address of said memory cell and an input address to provide an output;
redundant main word line drive means for maintaining said redundant main word line to a select level during a chip selecting state; and
select means for selecting either of the data read out of said memory cell and the data read out of said redundant memory cell, on the basis of the output of said address compare means.

2. A semiconductor memory device according to claim 1, wherein said redundant main word line drive means sets said redundant main word line to the select level in accordance with a memory enable state.

3. A semiconductor memory device according to claim 2, wherein said select means includes: a first sense amplifier for receiving and amplifying the data read out of said memory cell; and a second sense amplifier for receiving and amplifying the data read out from said redundant memory cell, and wherein said first and second sense amplifiers are selectively driven.

4. A semiconductor memory device according to claim 2, wherein said select means includes: a first sense amplifier for receiving and amplifying the data read out of said memory cell; a second sense amplifier for receiving and amplifying the data read out from said redundant memory cell; and first and second data output buffers corresponding to said first and second sense amplifiers, respectively, and wherein said first and second data output buffers have their output terminals coupled to a data outputting single external terminal.

5. A semiconductor memory device according to claim 4, wherein said select means operates on the basis of both a first control signal for instructing which of a first memory mat containing said memory cell and a second memory mat containing said redundant memory cell is to be selected and a second control signal indicating the state in which said redundant sub word line is to be selected.

6. A semiconductor memory device comprising:
a main word line;
a sub word line corresponding to said main word line and coupled to the select terminal of a memory cell;
sub word drive means for driving said sub word line on the basis of a signal to be transmitted to said main word line and a sub word select signal;
a redundant main word line;
a redundant sub word line corresponding to said redundant main word line and coupled to the select terminal of a redundant memory cell;
redundant sub word line drive means for driving said redundant sub word line on the basis of a signal to be transmitted to said redundant main word line and a redundant select signal;
address compare means for comparing the address of said memory cell and an input address;
redundant main word line drive means for driving said redundant main word line to a select level not depending upon the output of said address compare means;
select means for selecting either of the data read out of said memory cell and the data read out of said redundant memory cell, on the basis of the output of said address compare means;
wherein said redundant main word line drive means sets said redundant main word line to the select level in accordance with a memory enable state;
wherein said select means includes: a first sense amplifier for receiving and amplifying the data read out of said memory cell; a second sense amplifier for receiving and amplifying the data read out from said redundant memory cell; and first and second data output buffers corresponding to said first and second sense amplifiers, respectively, and wherein said first and second data output buffers have their output terminals coupled to a data outputting single external terminal;
wherein said select means operates on the basis of both a first control signal for instructing which of a first memory mat containing said memory cell and a second memory mat containing said redundant memory cell is to be selected and a second control signal indicating the state in which said redundant sub word line is to be selected; and
a plurality of externally connected electrodes which are disposed at the center portion of a semiconductor substrate and across which are arranged said first memory mat and said second memory mat;
wherein said redundant main and sub word lines are arranged in parallel to the center portion on which said plurality of externally connected electrodes are disposed; and wherein
data lines are disposed perpendicular to said redundant main and sub word lines.

7. A semiconductor memory device according to claim 6, wherein the redundant memory cells contained in said first memory mat and said second memory mat are arranged relatively close to said externally connected electrodes.

8. A semiconductor memory device, comprising:

a plurality of main memory cells, each having an address, and a plurality of redundant memory cells, each of said main memory cells and said redundant memory cells having a select terminal and providing data read out;

a main word line for said plurality of main memory cells;

a plurality of sub word lines corresponding to said main word line and respectively coupled to the select terminals of different groupings of said main memory cells;

main word line drive means for driving said main word line to a select level;

a plurality of sub word drive means for respectively driving said sub word lines to a select level on the basis of a sub word select signal;

a redundant main word line for said redundant memory cells;

a plurality of redundant sub word lines corresponding to said redundant main word line and coupled to the select terminals of said redundant memory cells, respectively;

program means settable to logically replace a defective one of said main memory cells with one of said redundant memory cells by providing a redundant memory cell select signal in response to an address for the defective one of said main memory cells;

redundant sub word line drive means responsive to said redundant memory cell select signal for driving said redundant sub word lines to a select level, respectively;

redundant main word line drive means for driving said redundant main word line to a select level substantially in parallel with the driving of said main word line driving means and independently of the redundant memory cell select signal; and select means for selecting the data read out of the one of said redundant memory cells in preference to the data read out of the defective one of said memory cells in response to the redundant memory cell select signal, so that the redundant main word line is driven to the select level without waiting for the redundant memory cell select signal.

9. A semiconductor memory device according to claim 8, wherein said select means include data output buffers respectively assigned to said main memory cells and said redundant memory cells and being activated to select either the data read out of the defective one of said main memory cells or the data read out of the one of said redundant memory cells.

10. A semiconductor memory device according to claim 8, further including a common output buffer shared by said main memory cells and said redundant memory cells; and wherein said select means includes a plurality of sense amplifiers between said common output buffer and each of said main memory cells and said redundant memory cells, respectively, and said sense amplifiers being selectively activated to select the data read out.

11. A semiconductor memory device according to claim 8, constructed entirely on a single chip and including a plurality of data input output bonding pads; and wherein said redundant memory cells are arranged closer to said bonding pads than said main memory cells so that a transmission passage of the data read out from the redundant memory cells is shorter than the longest transmission passage of the data read out from the main memory cells.

12. A semiconductor memory device according to claim 8, wherein said main memory cells and redundant memory cells are divided into a plurality of memory array areas, with each memory array area including a plurality of main memory cells and a plurality of redundant memory cells;

each memory array area having a main word line, a redundant main word line, a plurality of sub word lines, and a plurality of redundant sub word lines; and said program means assigning a redundant memory cell of one memory array area to the address of a defective memory cell of only another memory array area.

13. A semiconductor memory device according to claim 12, wherein within each memory array area a main memory cell and a redundant memory cell are commonly connected with complimentary bit lines.

14. A semiconductor memory device according to claim 8, wherein said program means includes a plurality of fuses selectively cuttable to program.

15. A semiconductor memory device according to claim 12, constructed entirely on a single chip and including a plurality of data input output bonding pads; and wherein said redundant memory cells are arranged closer to said bonding pads than said main memory cells so that a transmission passage of the data read out from the redundant memory cells is shorter than the longest transmission passage of the data read out from the main memory cells.

16. A semiconductor memory device according to claim 13, wherein said program means includes a plurality of fuses selectively cuttable to program.

17. A semiconductor memory device according to claim 13, further including a common output buffer shared by said main memory cells and said redundant memory cells; and wherein said select means includes a plurality of sense amplifiers between said common output buffer and each of said main memory cells and said redundant memory cells, respectively, and said sense amplifiers being selectively activated to select the data read out.

18. A semiconductor memory device according to claim 13, constructed entirely on a single chip and including a plurality of data input output bonding pads; and wherein said redundant memory cells are arranged closer to said bonding pads than said main memory cells so that a transmission passage of the data read out from the redundant memory cells is shorter than the longest transmission passage of the data read out from the main memory cells.

19. A semiconductor memory device according to claim 13, wherein said select means include data output buffers respectively assigned to said main memory cells and said redundant memory cells and being activated to select either the data read out of the defective one of said main memory cells or the data read out of the one of said redundant memory cells.

20. A semiconductor memory device according to claim 16, constructed entirely on a single chip and including a plurality of data input output bonding pads; and wherein said redundant memory cells are arranged closer to said bonding pads than said main memory cells so that a transmission passage of the data read out from the redundant memory cells is shorter than the longest transmission passage of the data read out from the main memory cells.

* * * * *